United States Patent
Baba et al.

(10) Patent No.: US 10,270,150 B2
(45) Date of Patent: Apr. 23, 2019

(54) ELECTRONIC APPARATUS

(71) Applicant: Murata Manufacturing Co., Ltd., Nagaokakyo-shi, Kyoto-fu (JP)

(72) Inventors: Takahiro Baba, Nagaokakyo (JP); Nobuo Ikemoto, Nagakakyo (JP); Kosuke Nishino, Nagaokakyo (JP); Jun Sasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 169 days.

(21) Appl. No.: 15/290,124

(22) Filed: Oct. 11, 2016

(65) Prior Publication Data

US 2017/0033426 A1 Feb. 2, 2017

Related U.S. Application Data

(63) Continuation of application No. PCT/JP2015/082825, filed on Nov. 24, 2015, and a
(Continued)

(30) Foreign Application Priority Data

Dec. 1, 2014 (JP) .................. 2014-243252
Feb. 20, 2015 (JP) .................. 2015-031583
(Continued)

(51) Int. Cl.
*H01P 3/08* (2006.01)
*H05K 1/14* (2006.01)
(Continued)

(52) U.S. Cl.
CPC ............. *H01P 3/085* (2013.01); *H01P 3/08* (2013.01); *H05K 1/0239* (2013.01);
(Continued)

(58) Field of Classification Search
CPC . H01P 3/08; H01P 3/085; H01P 3/026; H05K 1/0239; H05K 1/0242;
(Continued)

(56) References Cited

U.S. PATENT DOCUMENTS 6,040,529 A 3/2000 Takeshita et al.
7,755,457 B2 * 7/2010 Lee .................. H01P 3/085
333/204

(Continued)

FOREIGN PATENT DOCUMENTS

JP 62-143438 A 6/1987
JP 62-146179 A 6/1987
(Continued)

OTHER PUBLICATIONS

Official Communication issued in International Patent Application No. PCT/JP2015/083524, dated Feb. 16, 2016.
(Continued)

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An electronic apparatus includes a first substrate and a second substrate mounted on the first substrate and having a smaller area than the first substrate. The second substrate extends in a longitudinal direction and has a planar or substantially planar shape with a uniform or substantially uniform width across all portions of the second substrate in the longitudinal direction. The second substrate includes a signal line, and a high-frequency transmission line including the signal line, and further includes an input/output pad electrically connected to the signal line, and an auxiliary pad arranged between two input/output pads, on the mounting surface of the second substrate. The first substrate includes lands each connected to the input/output pad and the aux-
(Continued)

iliary pad. The input/output pad and the auxiliary pad are each soldered on each of the lands of the first substrate and, thus, the second substrate is surface-mounted on the first substrate.

16 Claims, 24 Drawing Sheets

Related U.S. Application Data continuation of application No. PCT/JP2015/083524, filed on Nov. 30, 2015.

(30) Foreign Application Priority Data

| Apr. 14, 2015 | (JP) | 2015-082161 |
|---|---|---|
| Jul. 3, 2015 | (JP) | 2015-134048 |
| Sep. 18, 2015 | (JP) | 2015-184589 |

(51) Int. Cl.
| H05K 1/02 | (2006.01) |
|---|---|
| H05K 1/03 | (2006.01) |
| H05K 1/11 | (2006.01) |
| H01P 3/02 | (2006.01) |

(52) U.S. Cl.
CPC ......... *H05K 1/0242* (2013.01); *H05K 1/0245* (2013.01); *H05K 1/0298* (2013.01); *H05K 1/0313* (2013.01); *H05K 1/111* (2013.01); *H05K 1/141* (2013.01); *H05K 1/147* (2013.01); *H01P 3/026* (2013.01); *H05K 1/0243* (2013.01); *H05K 1/144* (2013.01); *H05K 2201/0141* (2013.01)

(58) Field of Classification Search
CPC .. H05K 1/0245; H05K 1/0298; H05K 1/0313; H05K 1/111; H05K 1/141; H05K 1/147; H05K 1/0243; H05K 1/144; H05K 2201/0141
USPC ................................ 333/238, 245, 246, 247
See application file for complete search history.

(56) References Cited

U.S. PATENT DOCUMENTS

| 2004/0207432 A1 | 10/2004 | Otsuka et al. |
|---|---|---|
| 2007/0057363 A1 | 3/2007 | Nakamura et al. |
| 2011/0221649 A1* | 9/2011 | Price .................. H01P 3/085 343/850 |
| 2013/0127560 A1 | 5/2013 | Kato et al. |
| 2014/0003007 A1 | 1/2014 | Shiroki et al. |
| 2014/0292449 A1 | 10/2014 | Kato et al. |

FOREIGN PATENT DOCUMENTS

| JP | 02-92967 U | 7/1990 |
|---|---|---|
| JP | 03-88367 U | 9/1991 |
| JP | 03-237802 A | 10/1991 |
| JP | 04-86798 U | 7/1992 |
| JP | 5-6911 U | 1/1993 |
| JP | 07-86814 A | 3/1995 |
| JP | 9-307208 A | 11/1997 |
| JP | 10-233564 A | 9/1998 |
| JP | 2001-257487 A | 9/2001 |
| JP | 2002-84108 A | 3/2002 |
| JP | 2003-298318 A | 10/2003 |
| JP | 2004-207949 A | 7/2004 |
| JP | 2004-259722 A | 9/2004 |
| JP | 2007-073766 | 3/2007 |
| JP | 2008-270304 A | 11/2008 |
| JP | 2009-224358 A | 10/2009 |
| JP | 2011-071403 A | 4/2011 |
| JP | 3173143 U | 1/2012 |
| JP | 2013-157308 A | 8/2013 |
| JP | 2014-30173 A | 2/2014 |
| JP | 2014-140012 A | 7/2014 |
| JP | 2014-192384 A | 10/2014 |
| WO | 2012/074101 A1 | 6/2012 |

OTHER PUBLICATIONS

Official Communication issued in International Patent Application No. PCT/JP2015/083525, dated Feb. 16, 2016.
Official Communication issued in corresponding Japanese Patent Application No. 2016-544178, dated Sep. 13, 2016.
Official Communication issued in corresponding Japanese Patent Application No. 2016-252194, dated Sep. 26, 2017.
Official Communication issued in corresponding Japanese Patent Application No. 2016-545382, dated Sep. 13, 2016.
Official Communication issued in corresponding Japanese Patent Application No. 2016-252586, dated Oct. 10, 2017.

* cited by examiner

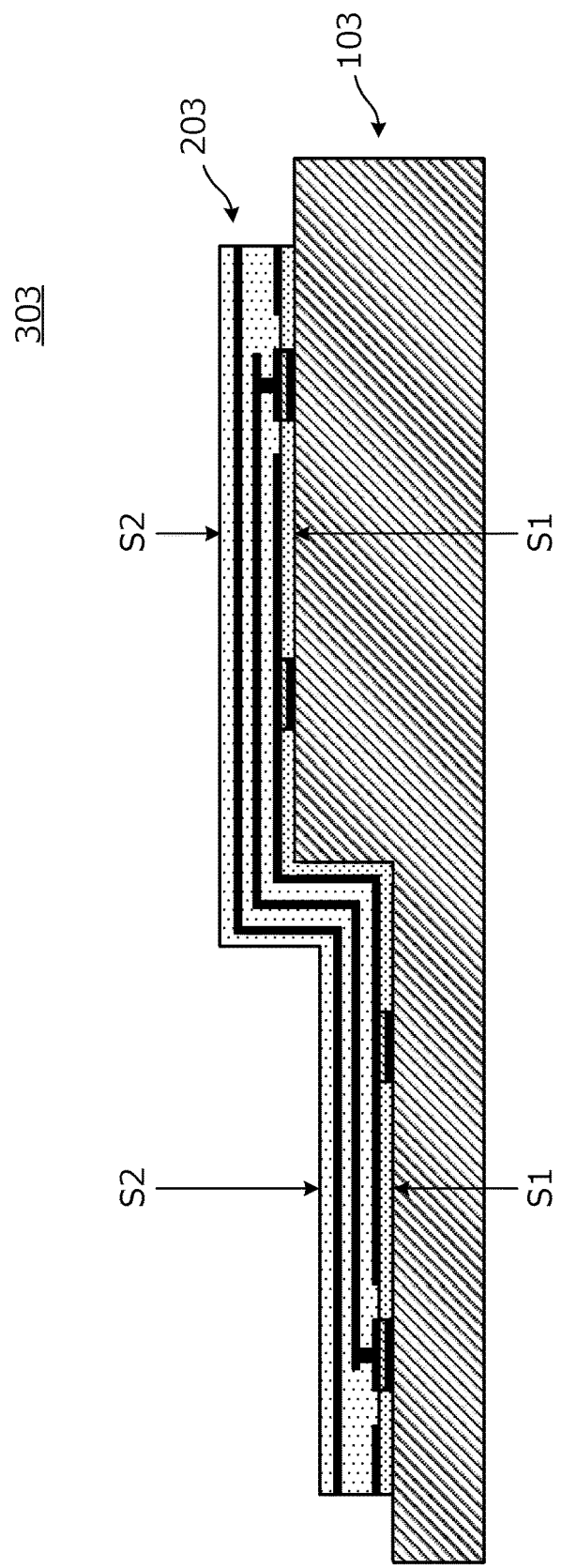

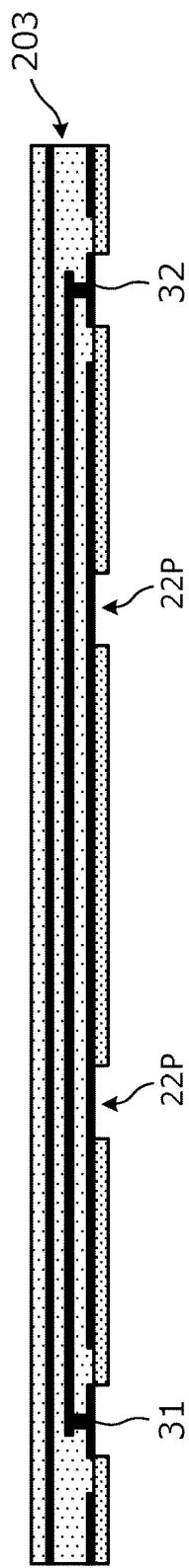
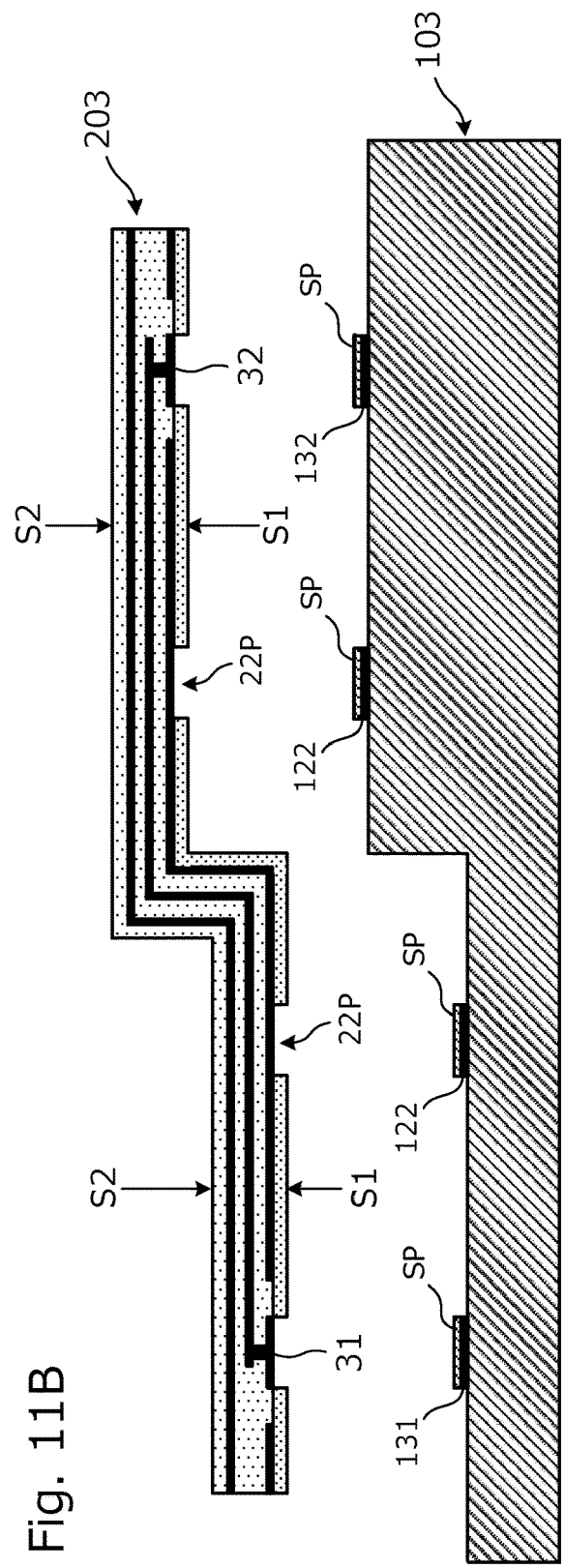
Fig. 11A
Fig. 11B

ELECTRONIC APPARATUS

CROSS REFERENCE TO RELATED APPLICATIONS

This application claims the benefit of priority to Japanese Patent Application 2014-243252 filed Dec. 1, 2014, Japanese Patent Application 2015-031583 filed Feb. 20, 2015, Japanese Patent Application 2015-082161 filed Apr. 14, 2015, Japanese Patent Application 2015-134048 filed Jul. 3, 2015, and Japanese Patent Application 2015-184589 filed Sep. 18, 2015 and is a Continuation Application of PCT/JP2015/082825 filed on Nov. 24, 2015 and PCT/JP2015/083524 filed on Nov. 30, 2015. The entire contents of each of these applications are hereby incorporated by reference herein.

BACKGROUND OF THE INVENTION

1. Field of the Invention

The present invention relates to an electronic apparatus including a substrate and an electronic element that is surface-mounted on the substrate.

2. Description of the Related Art

For example, in an electronic apparatus provided with a high-frequency circuit, it is often spatially difficult to install a transmission line having a certain length or longer together with a substrate in a casing.

Japanese Patent Laid-Open publication No. 2001-257487 discloses a method of fixing a coaxial cable connected to an antenna. In the apparatus disclosed in Japanese Patent Laid-Open publication No. 2001-257487, the coaxial cable is inserted into a cut portion, fitted in a curved portion, and fixed by being confined in the curved portion.

In an electronic apparatus provided with a relatively long member that has a certain length, such as a coaxial cable, together with a substrate, the long member is generally arranged so as to avoid a mounting component on the substrate. However, a long member, such as a coaxial cable, is easily deformed, and it has been difficult to fix such a long member in a limited space.

SUMMARY OF THE INVENTION

Preferred embodiments of the present invention provide an electronic apparatus in which an elongated member together with a substrate is installed in a limited space.

An electronic apparatus according to a preferred embodiment of the present invention includes a first substrate including a mounting surface; and a second substrate including a mounting surface mounted on the first substrate and having a smaller area than the first substrate. The second substrate also extends in a longitudinal direction and has a planar or substantially planar shape with a uniform or substantially uniform width across all portions of the second substrate in the longitudinal direction. The second substrate includes a signal line; a high-frequency transmission line including the signal line; an input/output pad electrically connected to the signal line on the mounting surface; and an auxiliary pad between two input/output pads on the mounting surface. The first substrate includes a plurality of lands provided on the mounting surface of the first substrate and the lands are each connected to the input/output pad and the auxiliary pad. The input/output pad and the auxiliary pad are each soldered on each of the plurality of lands of the first substrate and then the second substrate is surface-mounted on the first substrate such that an entirety of the mounting surface of the second substrate faces the mounting surface of the first substrate.

With the above configuration, the second substrate is able to be arranged so as to avoid other components on the first substrate and is also able to be fixed such that the entire surface of the second substrate faces the first substrate, so that a shift in position when using a coaxial cable does not occur and, thus, a manufacturing process is simplified since the second substrate is able to be mounted in a reflow process. In addition, since the auxiliary pad is arranged between the input/output pads, even if the second substrate has a relatively large length, the strength when such a second substrate is surface-mounted on the first substrate is high, and the deformation after the second substrate is mounted is significantly reduced.

In an electronic apparatus according to a preferred embodiment of the present invention, the input/output pad and the auxiliary pad may preferably be arranged in the longitudinal direction. Accordingly, the second substrate does not expand in a width direction (in a direction perpendicular or substantially perpendicular to the longitudinal direction) and is arranged in a limited space on the first substrate.

In an electronic apparatus according to a preferred embodiment of the present invention, the second substrate may preferably be made of a base material having a relative dielectric constant that is lower than a relative dielectric constant of the first substrate. Accordingly, compared to a non-limiting example in which the high-frequency transmission line is directly provided on the first substrate, the wavelength shortening effect is weakened, the number of waves is decreased, and, thus, a loss is reduced. In addition, this structure enables the thickness of the second substrate to be reduced.

In an electronic apparatus according to a preferred embodiment of the present invention, the base material may preferably be a liquid crystal polymer, for example.

In an electronic apparatus according to a preferred embodiment of the present invention, the high-frequency transmission line may preferably include a ground conductor and the auxiliary pad may preferably be the ground conductor. Accordingly, since it is not necessary to include a special electrode for the auxiliary pad, a conductor pattern is simplified, which further reduces the thickness of the second substrate. In addition, the second substrate is connectable to ground on the side of the first substrate through the auxiliary pad. Moreover, since the second substrate is connected to the ground on the side of the first substrate through the auxiliary pad, the ground potential of the second substrate is stabilized.

In an electronic apparatus according to a preferred embodiment of the present invention, the second substrate may further preferably include a bent portion that bends in a planar direction of the mounting surface of the first substrate; and the second substrate may preferably be arranged on the first substrate so as to avoid components mounted on the first substrate. This makes it possible to arrange the second substrate in a limited space on the first substrate.

In an electronic apparatus according to a preferred embodiment of the present invention, the first substrate may preferably include a level difference portion and the second substrate may preferably be surface-mounted on the first substrate along the level difference portion. This makes it possible to arrange the second substrate in a limited space on the first substrate.

In an electronic apparatus according to a preferred embodiment of the present invention, the second substrate may preferably be previously deformed into a shape that conforms or substantially conforms to the level difference portion. This makes it possible to mount the second substrate on the first substrate in the usual surface-mounting process.

In an electronic apparatus according to a preferred embodiment of the present invention, the second substrate may further preferably include a plurality of base material layers and a plurality of conductor layers provided on the plurality of base material layers; and, among the plurality of conductor layers, a conductor layer on which the input/output pad is provided may preferably be the thickest. This significantly reduces deformation on the mounting surface of the second substrate and secures mounting characteristics.

In an electronic apparatus according to a preferred embodiment of the present invention, the signal line may preferably include a plurality of signal lines. This makes it possible to install a large number of transmission lines on the first substrate by a small number of components.

In an electronic apparatus according to a preferred embodiment of the present invention, the second substrate may further preferably include a plurality of base material layers, and a plurality of conductor layers provided on the plurality of base material layers; and the signal line may preferably include a plurality of signal lines; and the signal lines may preferably be each provided on different conductor layers among the plurality of the conductor layers. This makes it possible to install a large number of high-frequency transmission lines in a limited space on the first substrate without expanding or increasing the width of the second substrate.

In an electronic apparatus according to a preferred embodiment of the present invention, the input/output pad and the auxiliary pad may preferably be arranged in a single line. This makes it possible to reduce the width of the second substrate and, thus, to increase the flexibility of the arrangement of the second substrate with respect to the first substrate. In addition, the flexibility of the layout of the components that are mounted on the first substrate is also increased.

According to various preferred embodiments of the present invention, the second substrate is able to be arranged so as to avoid other components on the first substrate and is also able to be fixed such that the entire surface of the second substrate faces the first substrate, so that a shift in position when using a coaxial cable does not occur and, thus, a manufacturing process is simplified since the second substrate is able to be mounted in a reflow process.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 10 is a sectional view of a main portion of an electronic apparatus 303 according to a third preferred embodiment of the present invention.

FIG. 11A is a sectional view of a second substrate 203 with which the electronic apparatus 303 is provided before the second substrate 203 is preformed, and FIG. 11B is a sectional view of the second substrate 203 in a mounting process in which the preformed second substrate 203 is to be mounted to the first substrate 103.

DETAILED DESCRIPTION OF THE PREFERRED EMBODIMENTS

Figure 1:
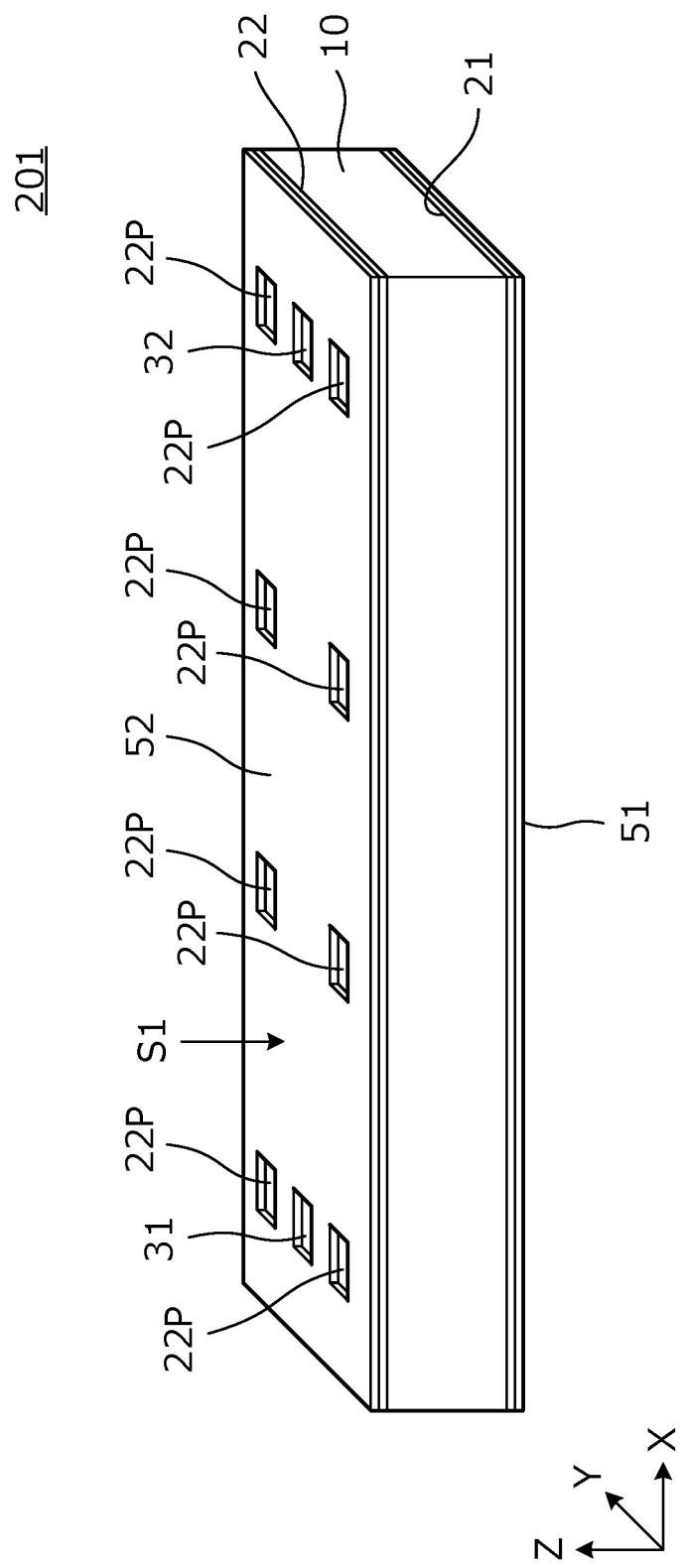
FIG. 1 is a perspective view of a main portion of a second substrate 201 with which an electronic apparatus according to a first preferred embodiment of the present invention is provided.

Hereinafter, a plurality of preferred embodiments of the present invention will be described with reference to the attached drawings and several specific examples. In the drawings, components and elements assigned with the same reference numerals or symbols will represent identical or substantially identical components and elements. In preferred embodiments after the second preferred embodiment, a description of matters common to the first preferred embodiment will be omitted, and different matters are primarily described. In particular, the same or substantially the same operational effects by the same or substantially the same configuration will not be described one by one for each preferred embodiment.

First Preferred Embodiment

Figure 2:
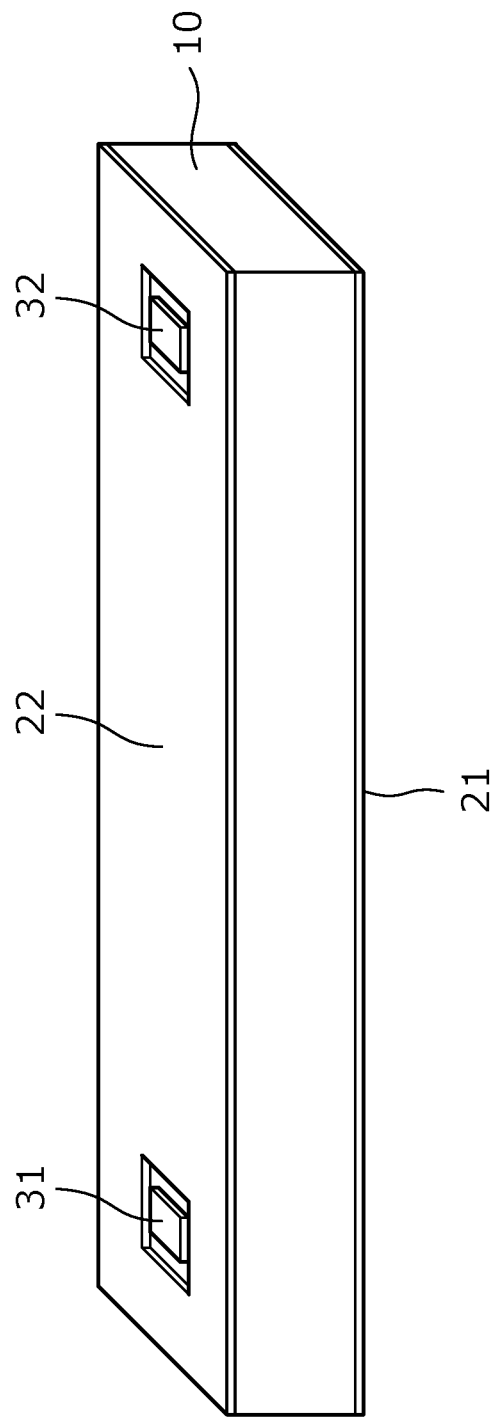
FIG. 2 is a perspective view of the second substrate 201 in a state before a protective film 52 is provided on the second substrate 201.
Figure 3:
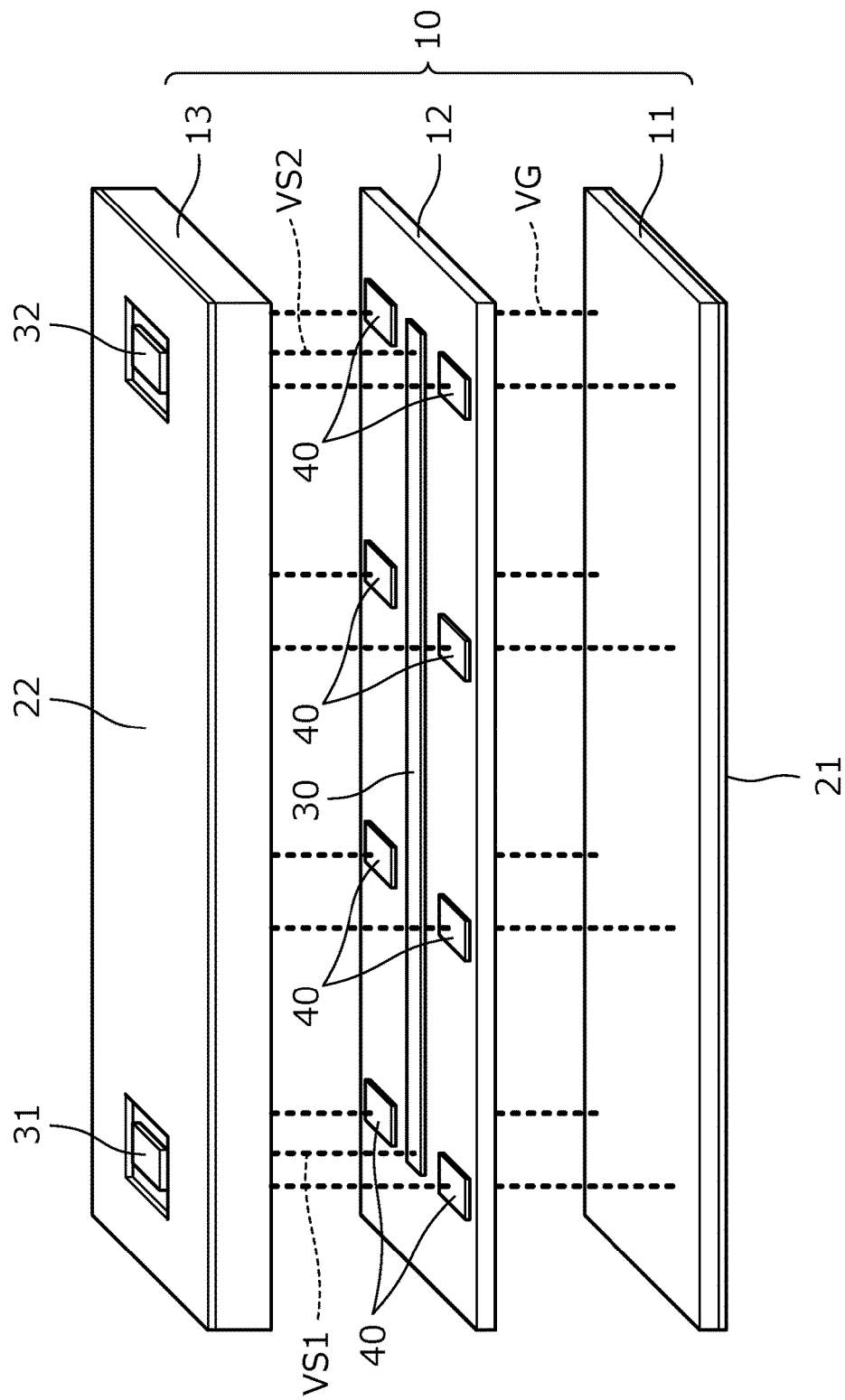
FIG. 3 is an exploded perspective view of the second substrate 201 in a state before the protective film 52 is provided on the second substrate 201.
Figure 4:
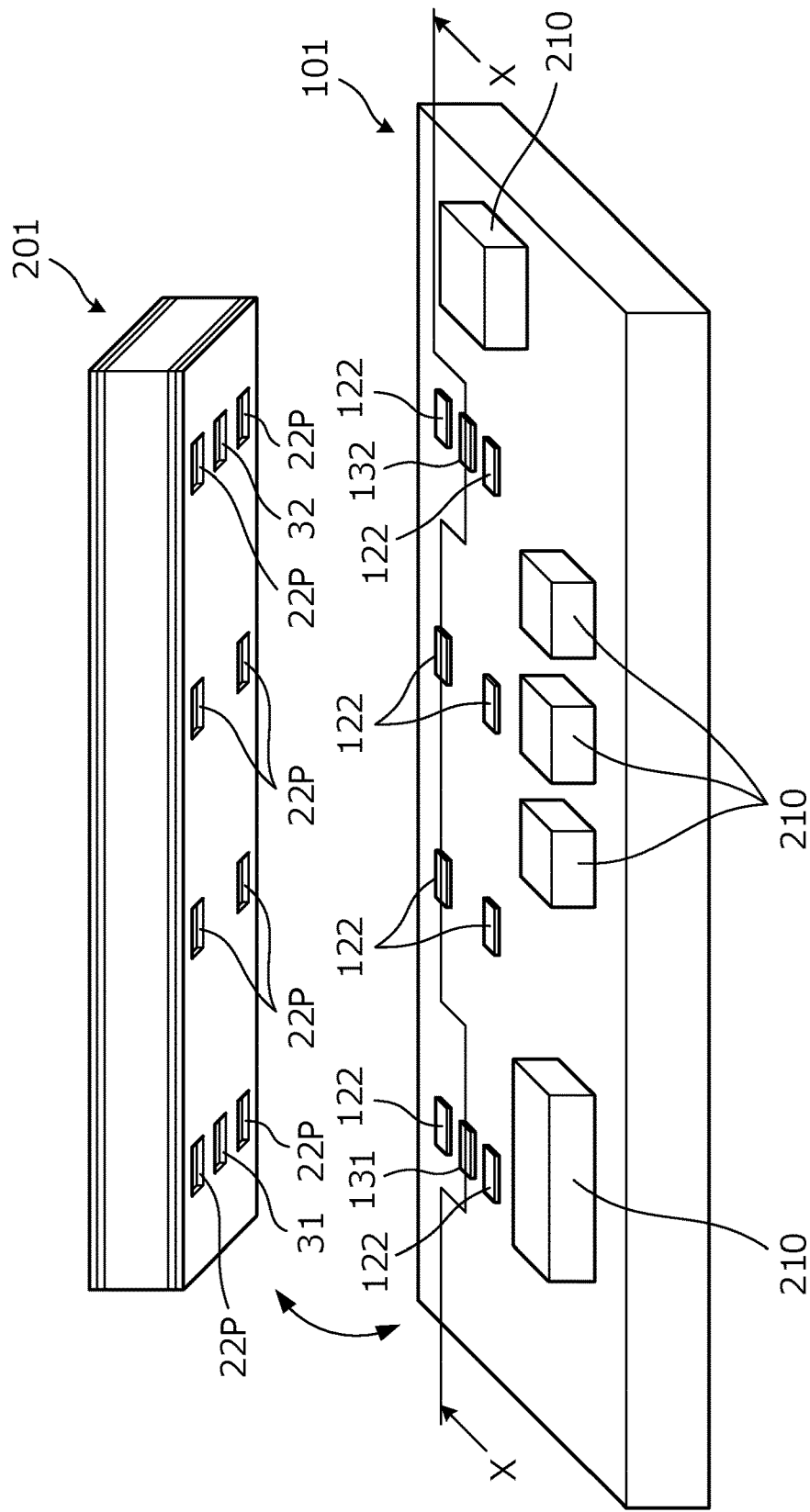
FIG. 4 is a perspective view illustrating a structure of a first substrate 101 and the second substrate 201 mounted on the first substrate 101.
Figure 7:
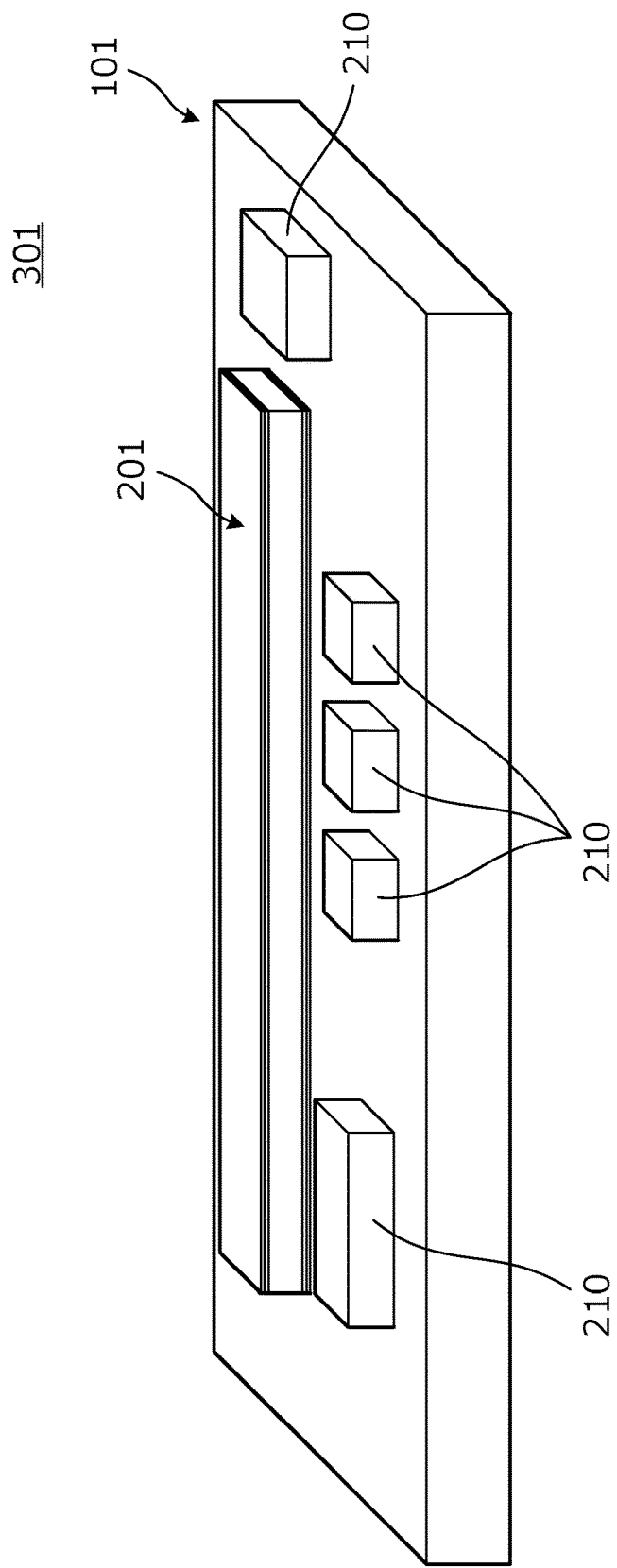
FIG. 7 is a perspective view of an electronic apparatus 301 configured by mounting the second substrate 201 on the first substrate 101.

FIG. 1 is a perspective view of a main portion of a second substrate 201 with which an electronic apparatus according to a first preferred embodiment of the present invention is provided and FIG. 2 is a perspective view of the second substrate 201 in a state before a protective film 52 is provided on the second substrate 201. In addition, FIG. 3 is an exploded perspective view of the second substrate 201 in a state before the protective film 52 is provided on the second substrate 201. FIG. 4 is a perspective view illustrating a structure of a first substrate 101 and the second substrate 201 mounted on the first substrate 101. Furthermore, FIG. 7 is a perspective view of an electronic apparatus 301 configured by mounting the second substrate 201 on the first substrate 101.

To begin with, the structure of the second substrate 201 is illustrated. As shown in FIG. 1, the second substrate 201 extends in a longitudinal direction (X axial direction in FIG. 1) and has a planar or substantially planar shape of which the width in each portion in the longitudinal direction (dimension in the Y axial direction) is uniform or substantially uniform.

The second substrate 201 includes a first surface S1, and input/output pads 31 and 32 and a plurality of auxiliary pads 22P arranged between the input/output pads 31 and 32 on the first surface S1. The second substrate 201 is surface-mounted on the first substrate 101 to be described later, using the first surface S1 as a mounting surface.

The second substrate 201 further includes a protective film 52 provided on the first surface S1, and a protective film 51 provided on the opposite surface. The protective films 51 and 52, as shown in FIG. 2, include a first ground conductor 21 and a second ground conductor 22, respectively, on the lower layers of the protective films 51 and 52. The plurality of auxiliary pads 22P are each defined by a portion of the second ground conductor 22 exposed in an opening provided in the protective film 52.

The base material 10 of the second substrate 201, as shown in FIG. 3, includes base materials 11, 12, and 13. The base materials 11, 12, and 13 may preferably be, for example, an insulating base material of thermoplastic resin, such as a liquid crystal polymer (LCP) sheet having a relative dielectric constant of about 3. Each conductor pattern is preferably defined by patterning copper foil attached on the insulating base material, for example.

The base material 11 includes the first ground conductor 21 provided on the entire or substantially the entire surface of the lower surface of the base material 11. The base material 12 includes a signal line 30 and a via receiving electrode 40 arranged along the opposite sides of the signal line 30 on the upper surface of the base material 12. The base material 13 includes the second ground conductor 22 and the input/output pads 31 and 32 on the upper surface of the base material 13. The first ground conductor 21 is connected to the second ground conductor 22 through a via VG. The opposite ends of the signal line 30 are connected to the input/output pads 31 and 32, respectively, through vias VS1 and VS2.

The first ground conductor 21, the second ground conductor 22, and the signal line 30 define a high-frequency transmission line having a stripline structure.

The second ground conductor 22 is preferably thicker than the first ground conductor 21. For example, the first ground conductor 21 may have a thickness in the range of about 6 μm to about 12 μm, and the second ground conductor 22 may have a thickness in the range of about 12 μm to about 36 μm. Thus, by thickening the ground conductor on the side of the mounting surface of the second substrate, deformation of the mounting surface is significantly reduced or prevented, the second substrate 201 is prevented from being partially lifted or delaminated from the first substrate 101, and the mounting reliability of the second substrate 201 to the first substrate 101 is effectively increased.

As shown in FIG. 4, the first substrate 101 includes lands 131 and 132 structured to be connected to the input/output pads 31 and 32 of the second substrate 201, and lands 122 structured to be connected to the plurality of auxiliary pads 22P, on the upper surface of the first substrate 101. In addition, the first substrate 101 also includes lands structured to be connected to a plurality of mounting components 210, on the upper surface of the first substrate 101. In the same manner as the mounting components 210, the second substrate 201 is mounted on the first substrate 101. The first substrate 101 may preferably be, for example, a glass epoxy substrate, such as an FR 4, of which the relative dielectric constant of the base material is about 5.

Figure 5:
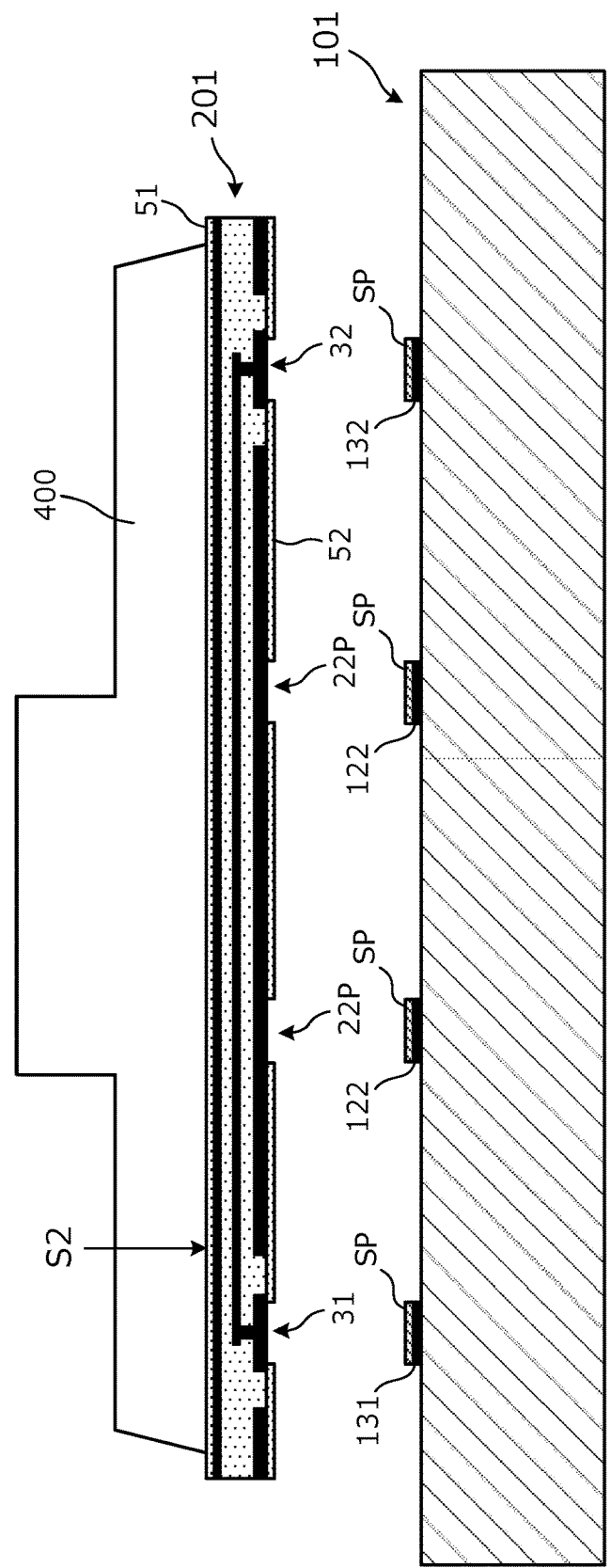
FIG. 5 is a sectional view illustrating a state in which the second substrate 201 in a mounting process is being mounted to the first substrate 101.
Figure 6:
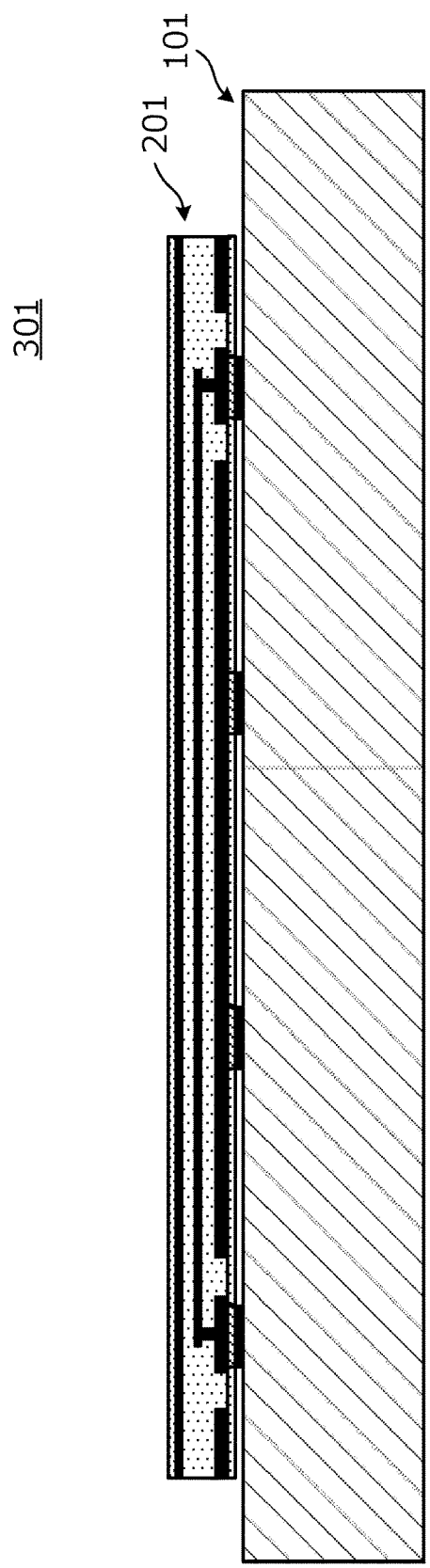
FIG. 6 is a sectional view illustrating a state in which the second substrate 201 has been mounted to the first substrate 101.

FIG. 5 is a sectional view illustrating a state in which the second substrate 201 in a non-limiting example of a mounting process is being mounted to the first substrate 101. FIG. 6 is a sectional view illustrating a state in which the second substrate 201 has been mounted to the first substrate 101. Both are sectional views, taken on line X-X in FIG. 4.

The surfaces of the lands 131, 132, and 122 provided on the first substrate 101 are, respectively, pre-coated with solder SP.

In order to mount the second substrate 201, a vacuum absorption chuck (not illustrated) may preferably be used, for example. The vacuum absorption chuck includes a tip tool 400. The tip tool 400 includes an absorption surface of which the size is large enough to cover the entire or substantially the entire second surface of the second substrate 201. A plurality of the second substrates 201 are previously stored in a pallet. The vacuum absorption chuck to which the tip tool 400 has been attached picks up one of the second substrates 201 from the pallet, and places the second substrate 201 in a predetermined position of the first substrate 101. Subsequently, the first substrate 101 is passed through a reflow furnace, so that the second substrate 201 together with other elements is soldered on the first substrate 101 by a batch reflow soldering method. In other words, the second substrate 201 is mounted as a surface mounting component as well as the other elements. This produces an electronic apparatus 301 shown in FIG. 7.

At the time of soldering, a self-alignment function is provided in the second substrate 201 so that the solder may be settled in the input/output pads 31 and 32 and the auxiliary pads 22P. Thus, the second substrate 201 is mounted with high precision on the first substrate 101.

In addition, since the plurality of auxiliary pads 22P are included, even if a distance between the input/output pad 31 and the input/output pad 32 is relatively long, the second substrate 201 is able to be prevented from abnormally moving with respect to a substrate at the time of the batch soldering by the reflow soldering method.

It is to be noted that, instead of the lands 131, 132, and 122 of the first substrate 101, the surfaces of the pads 31, 32, and 22P of the second substrate 201 may be pre-coated with solder.

By the soldering, the input/output pads 31 and 32, and the plurality of auxiliary pads 22P of the second substrate 201 are connected to the lands 131, 132, and 122 provided on the first substrate 101, respectively.

The land 122 on the side of the first substrate 101 is a ground electrode, and the ground conductor of the high-frequency transmission line of the second substrate 201 is electrically connected to the ground on the side of the first substrate 101. Thus, the ground potential of the high-frequency transmission line is stabilized.

According to the above-described preferred embodiment of the present invention, the following advantageous effects are obtained.

The second substrate 201 is able to be arranged so as to avoid other components on the first substrate 101 and is also able to be fixed such that the entire or substantially the entire surface of the second substrate 201 faces the first substrate 101, so that a shift in position when using a coaxial cable does not occur and, thus, a manufacturing process is simplified since the substrate is able to be mounted in a reflow process.

The thin second substrate 201 is easy to deform, but the second substrate 201 is surface-mounted by not only the input/output pads 31 and 32 but also by the plurality of auxiliary pads 22P, so that the strength when the second substrate is surface-mounted on the first substrate is high, and the deformation after the second substrate is mounted is significantly reduced.

Since the input/output pads 31 and 32 and the plurality of auxiliary pads 22P are arranged in the longitudinal direction of the second substrate 201, the second substrate 201 does not expand in the width direction (in a direction perpendicular or substantially perpendicular to the longitudinal direction), and is arranged in a limited space on the first substrate 101.

Since the relative dielectric constant of the base material of the first substrate 101 is about 5 and the relative dielectric constant of the base material of the second substrate 201 is as low as about 3, compared to a case in which the high-frequency transmission line is directly provided on the first substrate 101, the wavelength shortening effect in the second substrate 201 is weakened, the number of waves on the high-frequency transmission line is decreased, and, thus, a loss is reduced. In addition, this enables the second substrate 201 to have a reduced thickness.

Since the high-frequency transmission line includes a ground conductor, and each of the plurality of auxiliary pads 22P is defined by a portion of the ground conductor, it is not necessary to provide a special electrode for the auxiliary pad, and a conductor pattern is simplified, which enables the thickness of the second substrate to be further reduced. In addition, the second substrate 201 is connectable to ground on the side of the first substrate 101 through the auxiliary pads 22P.

Second Preferred Embodiment

A second preferred embodiment of the present invention provides an example of an electronic apparatus provided with a second substrate including a bent portion that bends in the planar direction of a first surface.

Figure 8:
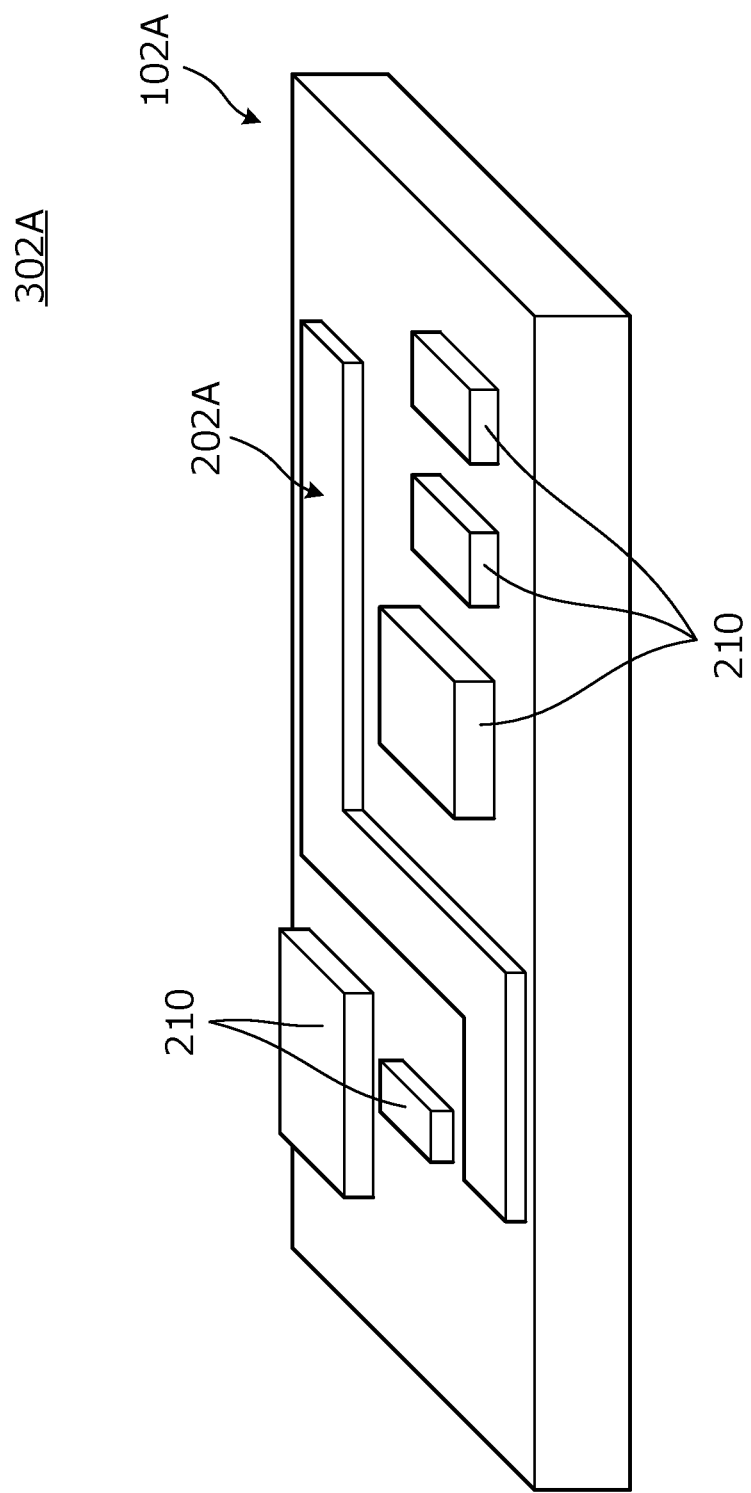
FIG. 8 is a perspective view of an electronic apparatus 302A according to a second preferred embodiment of the present invention.

FIG. 8 is a perspective view of the electronic apparatus 302A according to the second preferred embodiment of the present invention. The electronic apparatus 302A may preferably be an electronic apparatus in which a second substrate 202A and other mounting components 210 are mounted on a first substrate 102A.

Figure 9:
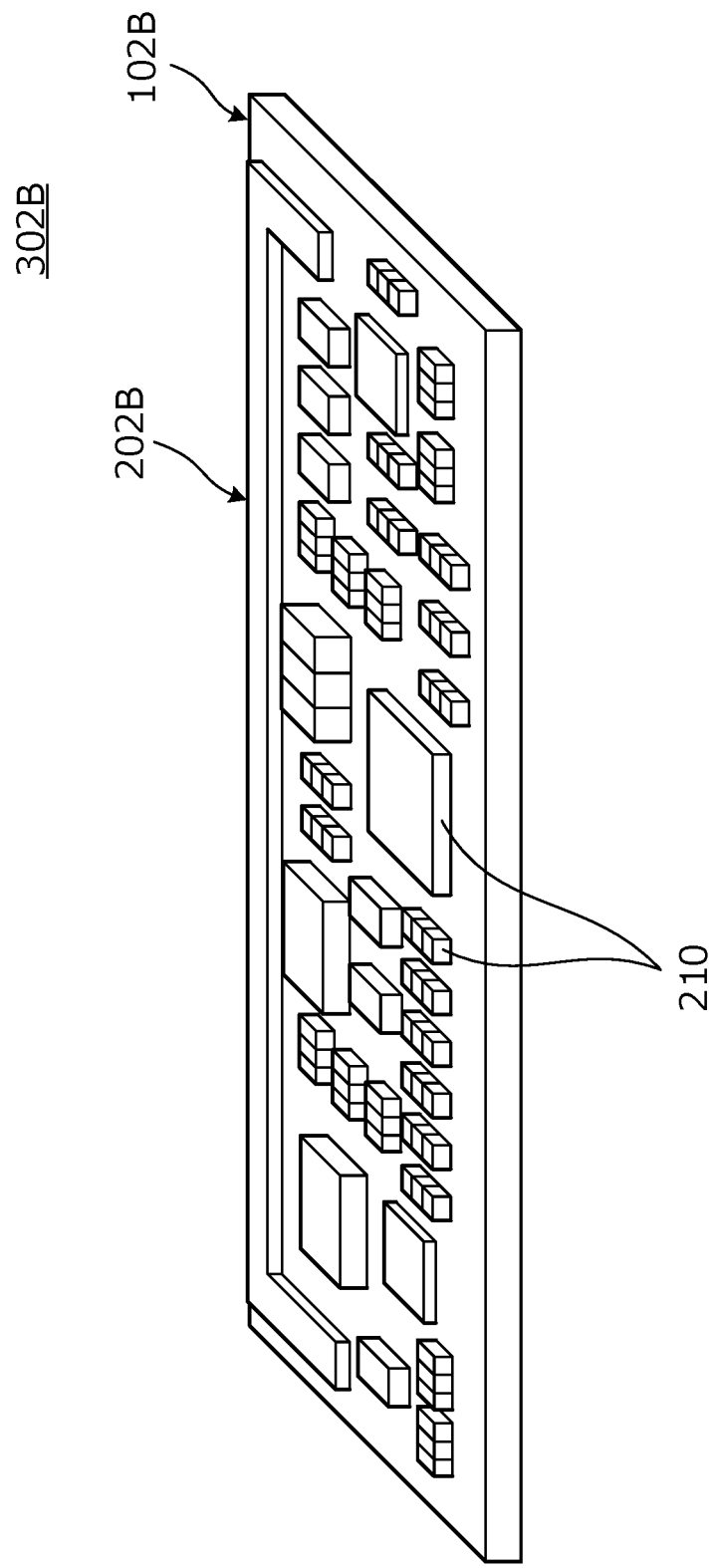
FIG. 9 is a perspective view of another electronic apparatus 302B according to the second preferred embodiment of the present invention.

FIG. 9 is a perspective view of another electronic apparatus 302B according to the second preferred embodiment. The electronic apparatus 302B may preferably be an electronic apparatus in which a second substrate 202B and other mounting components 210 are mounted on a first substrate 102B.

The second substrates 202A and 202B each include a bent portion that bends in the planar direction of the first surfaces defining mounting surfaces each to the first substrates 102A and 102B. The structure of the second substrates 202A and 202B may preferably be the same or substantially the same as the basic structure of the second substrate 201 described in the first preferred embodiment.

In the example shown in FIG. 8, the second substrate 202A is arranged so as to pass through a space among a plurality of mounting components 210. In the example shown in FIG. 9, the second substrate 202B is arranged along the edge of the first substrate 102B.

Thus, according to the present preferred embodiment, the second substrates 202A and 202B may preferably be arranged on the first substrates 102A and 102B so as to avoid components to be mounted on the first substrates 102A and 102B. This makes it possible to arrange the second substrates 202A and 202B in a limited space on the first substrates 102A and 102B.

Third Preferred Embodiment

A third preferred embodiment of the present invention provides an example of an electronic apparatus in which a second substrate is surface-mounted on a first substrate along a level-difference portion of the first substrate.

FIG. 10 is a sectional view of a main portion of the electronic apparatus 303 according to the third preferred embodiment. FIG. 11A is a sectional view of a second substrate 203 with which the electronic apparatus 303 is provided before the second substrate 203 is preformed, and FIG. 11B is a sectional view of the second substrate 203 in a mounting process in which the preformed second substrate 203 is to be mounted to the first substrate 103.

The electronic apparatus 303 of the present preferred embodiment includes the first substrate 103 and the second substrate 203 mounted on the first substrate 103. The first substrate 103 includes a level-difference portion, and the second substrate 203 is surface-mounted on the first substrate 103 along the level-difference portion.

The second substrate 203 is curved or bent in a thickness direction. The structure of the second substrate 203 may be the same or substantially the same as the basic structure of the second substrate 201 described in the first preferred embodiment. Since the base material of the second substrate 203 is preferably thermoplastic resin similar to the thermoplastic resin of the second substrate 201 in the first preferred embodiment, for example, the second substrate 203 is obtained by manufacturing the second substrate 201 described in the first preferred embodiment, to begin with, and then press-processing the second substrate 201 with a mold in the thickness direction of the second substrate 201 while being heated. The second substrate 203 includes a first surface S1 and a second surface S2 that are each partially flat even if being curved or bent in such a manner. Therefore, when picking up the second substrate 203, a tip tool of the vacuum absorption chuck may be conformed to the shape of the second substrate 203 is used. Alternatively, the main flat portion of the second substrate 203 may be absorbed by the tip tool.

According to the above-described preferred embodiment of the present invention, the following advantageous effects are obtained.

Even if the first substrate 103 has a level-difference portion, the second substrate 203 is mounted on the first substrate 103 so as to bridge the level-difference portion, such that the second substrate 203 may be arranged in a limited space on the first substrate 103.

Since the second substrate 203 is previously deformed into a shape that conforms to the level-difference portion of the first substrate 103 before being mounted, the second substrate 203 is able to be mounted on the first substrate 103 in the usual surface-mounting process.

It is to be noted that the second substrate may include both of the structure described in the second preferred embodiment and the structure described in the third preferred embodiment. In other words, the second substrate may include a bent portion that bends in the planar direction along the mounting surface, and may also include a curved or bent portion that curves or bends in the thickness direction.

Fourth Preferred Embodiment

A fourth preferred embodiment of the present invention provides an example of an electronic apparatus provided with a second substrate that includes a plurality of high-frequency transmission lines.

Figure 12:
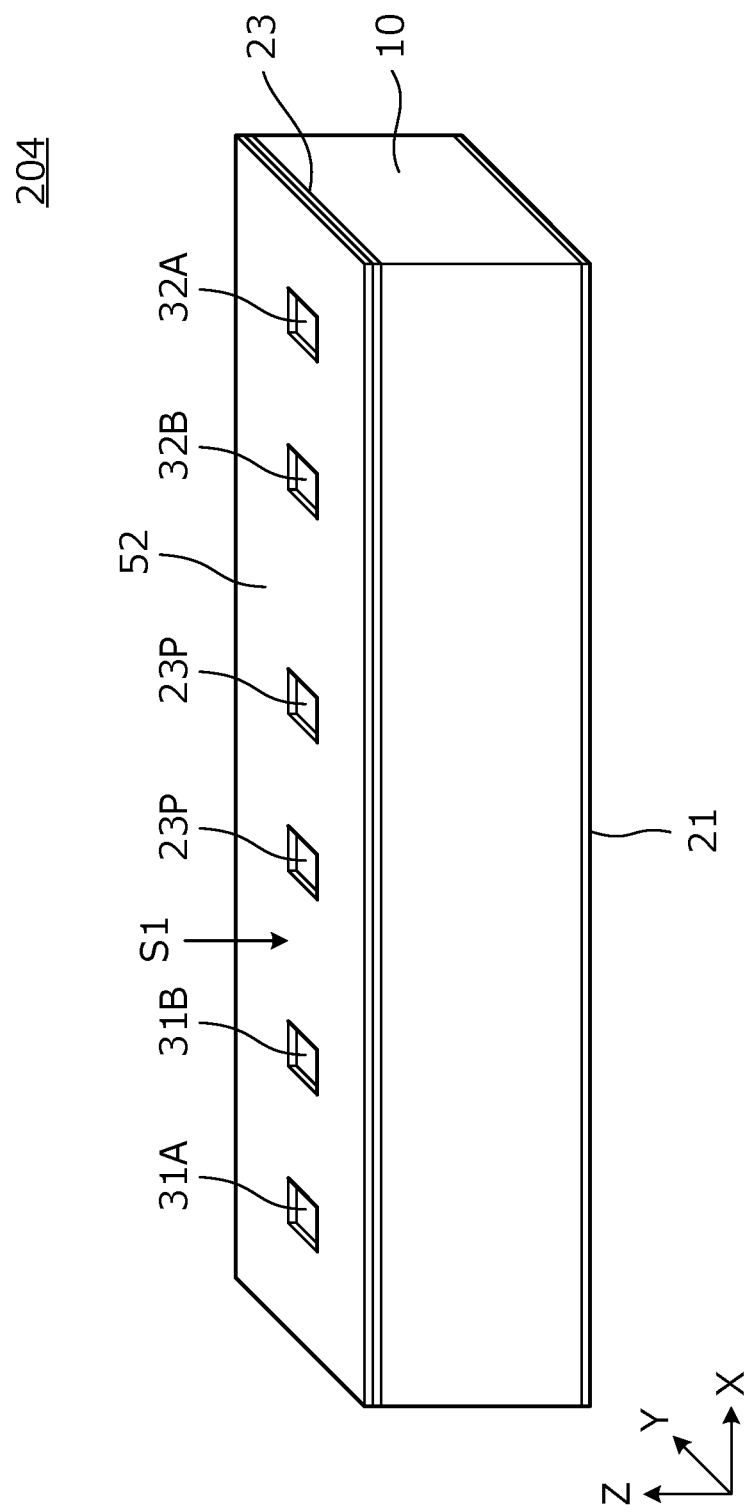
FIG. 12 is a perspective view of a main portion of a second substrate 204 with which an electronic apparatus according to a fourth preferred embodiment of the present invention is provided.
Figure 13:
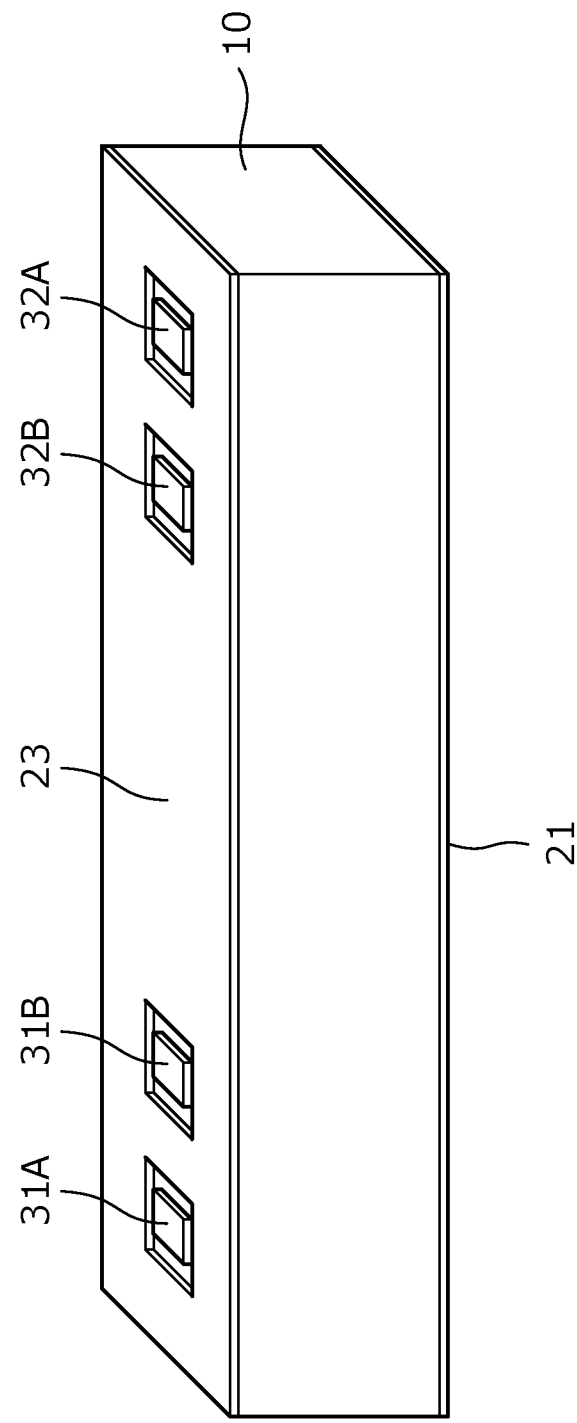
FIG. 13 is a perspective view of the second substrate 204 in a state before the protective film 52 is provided on the second substrate 204.
Figure 14:
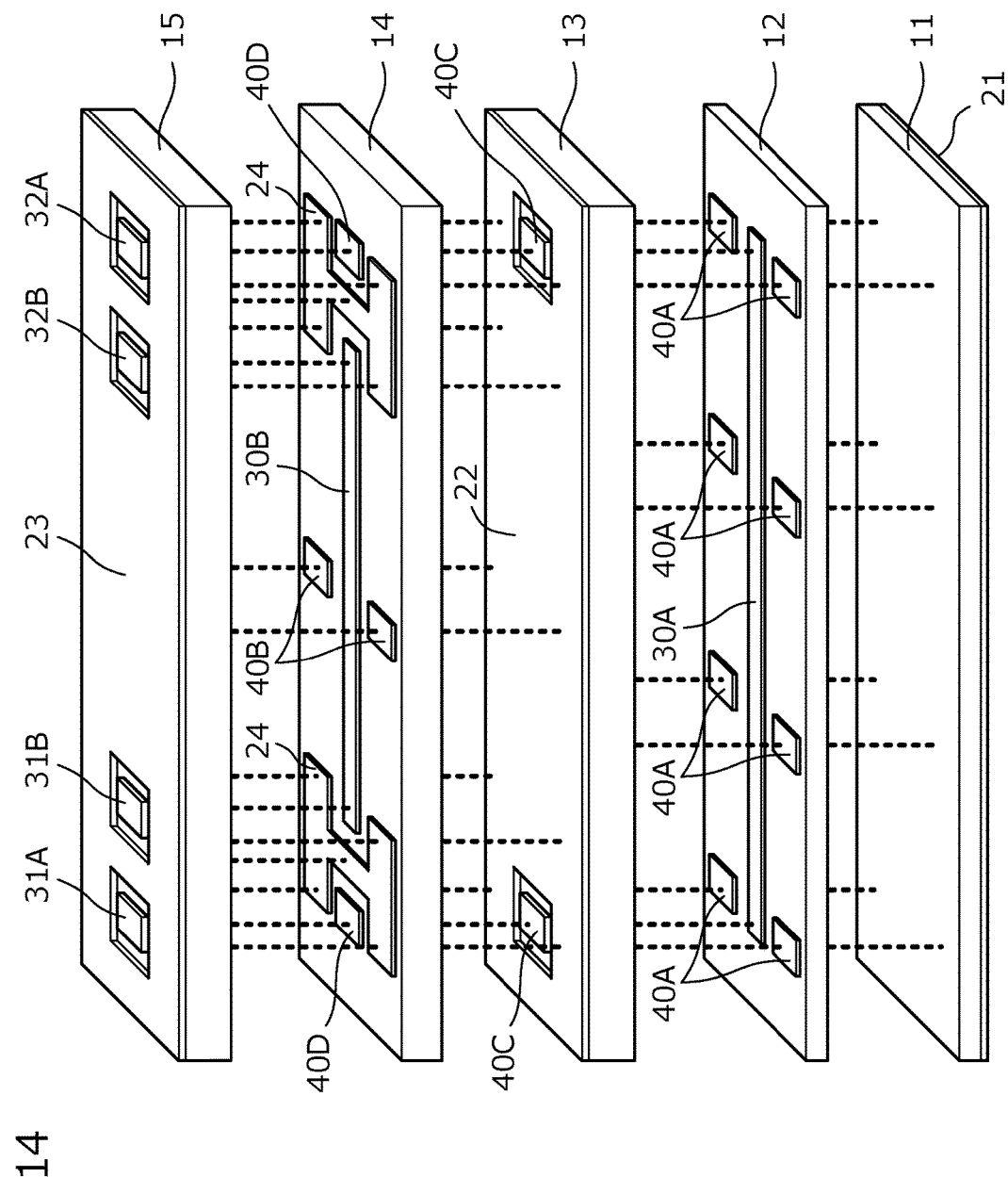
FIG. 14 is an exploded perspective view of the second substrate 204 in the state before the protective film 52 is provided on the second substrate 204.
Figure 15:
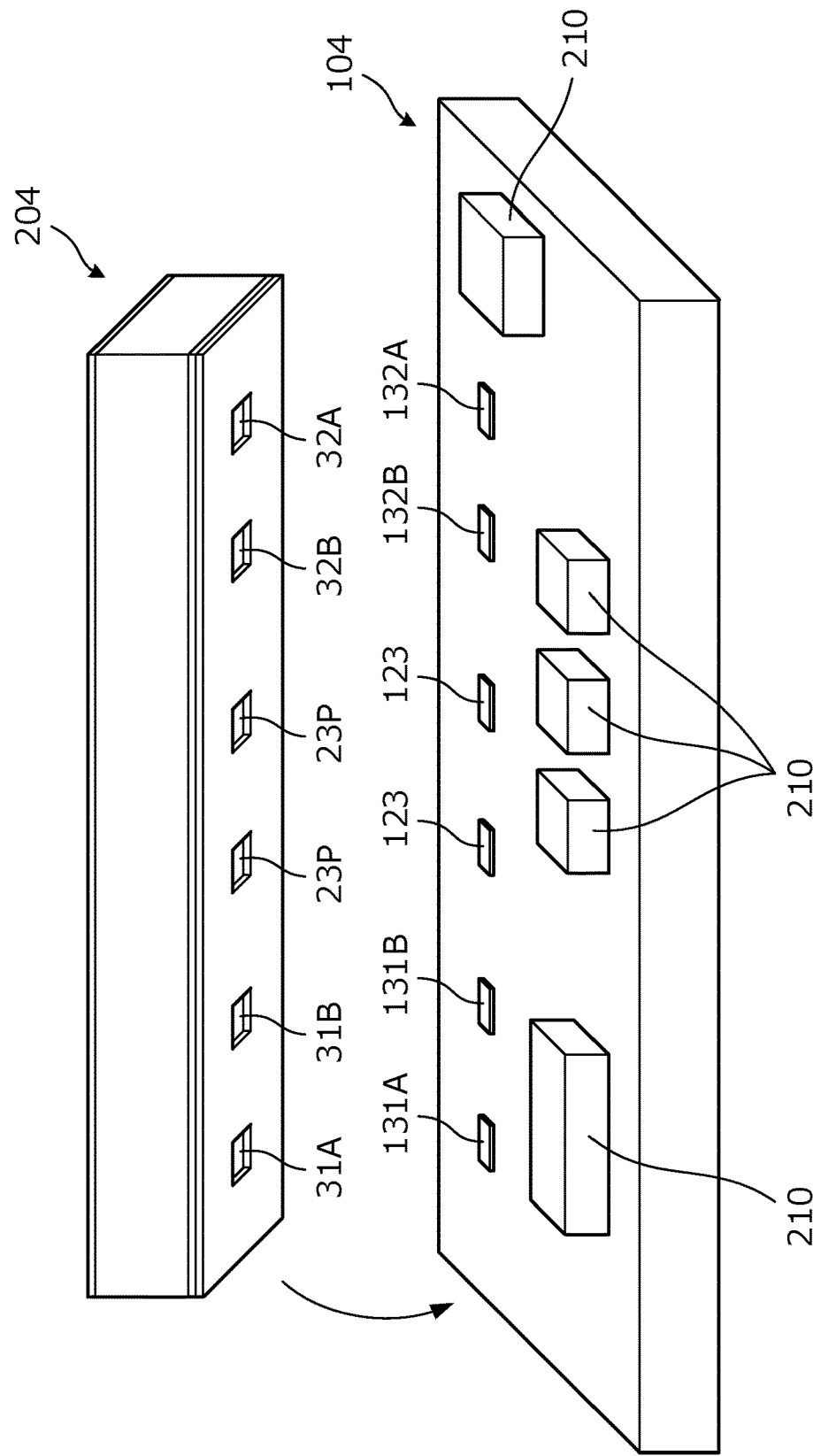
FIG. 15 is a perspective view illustrating a structure of a first substrate 104 and the second substrate 204 mounted on the first substrate 104.

FIG. 12 is a perspective view of a main portion of a second substrate 204 with which the electronic apparatus according to the fourth preferred embodiment is provided and FIG. 13 is a perspective view of the second substrate 204 in a state before a protective film 52 is provided on the second substrate 204. In addition, FIG. 14 is an exploded perspective view of the second substrate 204 in a state before the protective film 52 is provided on the second substrate 204. FIG. 15 is a perspective view illustrating a structure of a first substrate 104 and the second substrate 204 mounted on the first substrate 104.

As shown in FIG. 12, the second substrate 204 extends in a longitudinal direction (X axial direction in FIG. 12) and has a planar or substantially planar shape of which the width in each portion in the longitudinal direction (dimension in the Y axial direction) is uniform or substantially uniform.

The second substrate 204 includes a first surface S1 and input/output pads 31A, 31B, 32A, and 32B, and a plurality of auxiliary pads 23P arranged between the input/output pads 31B and 32B provided on the first surface S1. The second substrate 204 is surface-mounted on the first substrate 104 to be described later, using the first surface S1 as a mounting surface.

The second substrate 204 further includes a protective film 52 provided on the first surface S1. The protective film 52, as shown in FIG. 13, includes a third ground conductor 23 on the lower layer of the protective film 52. The plurality of auxiliary pads 23P are each defined by a portion of the third ground conductor 23 exposed in an opening provided in the protective film 52.

The base material 10 of the second substrate 204, as shown in FIG. 14, includes base materials 11 to 15. The base materials 11 to 15 may preferably be an insulating base material of thermoplastic resin, such as a liquid crystal polymer (LCP) sheet, for example. Each conductor pattern is defined preferably by patterning copper foil attached on the insulating base material, for example.

The base material 11 includes the first ground conductor 21 provided on the entire or substantially the entire surface of the lower surface of the base material 11. The base material 12 includes a signal line 30A and a via receiving electrode 40A arranged along the opposite sides of the signal line 30A on the upper surface of the base material 12. The base material 13 includes the second ground conductor 22 and a via receiving electrode 40C on the upper surface of the base material 13. The first ground conductor 21 is connected to the second ground conductor 22 through a via. The base material 14 includes a signal line 30B, a via receiving electrode 40B arranged along the opposite sides of the signal line 30B, and a via receiving electrode 40D arranged in the same or substantially the same position as the via receiving electrode 40C on the upper surface of the base material 14. The base material 15 includes a third ground conductor 23 and input/output pads 31A, 31B, 32A, and 32B on the upper surface of the base material 15.

The opposite ends of the signal line 30A are connected to the input/output pads 31A and 32A through the via. In addition, the opposite ends of the signal line 30B are connected to the input/output pads 31B and 32B through the via.

The first ground conductor 21, the second ground conductor 22, and the signal line 30A define a first high-frequency transmission line having a stripline structure. Moreover, the second ground conductor 22, the third ground conductor 23, and the signal line 30B define a second high-frequency transmission line having a stripline structure.

According to the present preferred embodiment, since a plurality of signal lines are integrally provided in the second substrate 204, the characteristic change due to a change in distance between the signal lines does not occur. In addition, a structure in which a plurality of signal lines are arranged in a laminating direction makes it possible to reduce a line width and arrange the second substrate 204 in a limited space on the first substrate 104. It is to be noted that a ground conductor 24 is provided between the end portion of the signal line 30B and the via receiving electrode 40D and, thus, crosstalk between the first high-frequency transmission line and the second high-frequency transmission line through the via is significantly reduced or prevented by the ground conductor 24.

As shown in FIG. 15, the first substrate 104 includes lands 131A, 131B, 132A, and 132B to be connected to the input/output pads 31A, 31B, 32A, and 32B of the second substrate 204, and lands 123 to be connected to the plurality of auxiliary pads 23P, on the upper surface of the first substrate 104. In addition, the first substrate 104 also includes lands to be connected to a plurality of mounting components 210, on the upper surface of the first substrate 104. In the same or substantially the same manner as the mounting components 210, the second substrate 204 is mounted on the first substrate 104.

Fifth Preferred Embodiment

A fifth preferred embodiment of the present invention provides an example of an electronic apparatus provided with a second substrate that includes a plurality of auxiliary pads in two lines.

Figure 16:
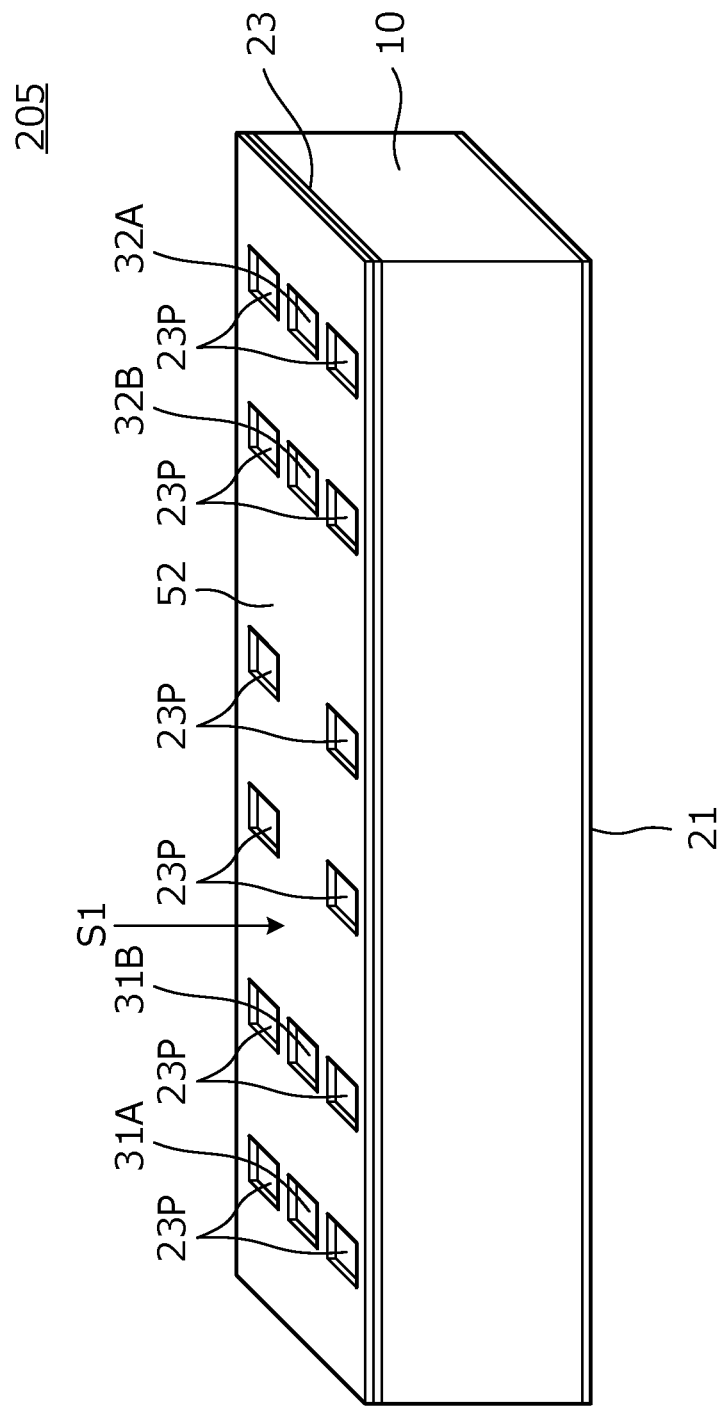
FIG. 16 is a perspective view of a main portion of a second substrate 205 with which an electronic apparatus according to a fifth preferred embodiment of the present invention is provided.
Figure 17:
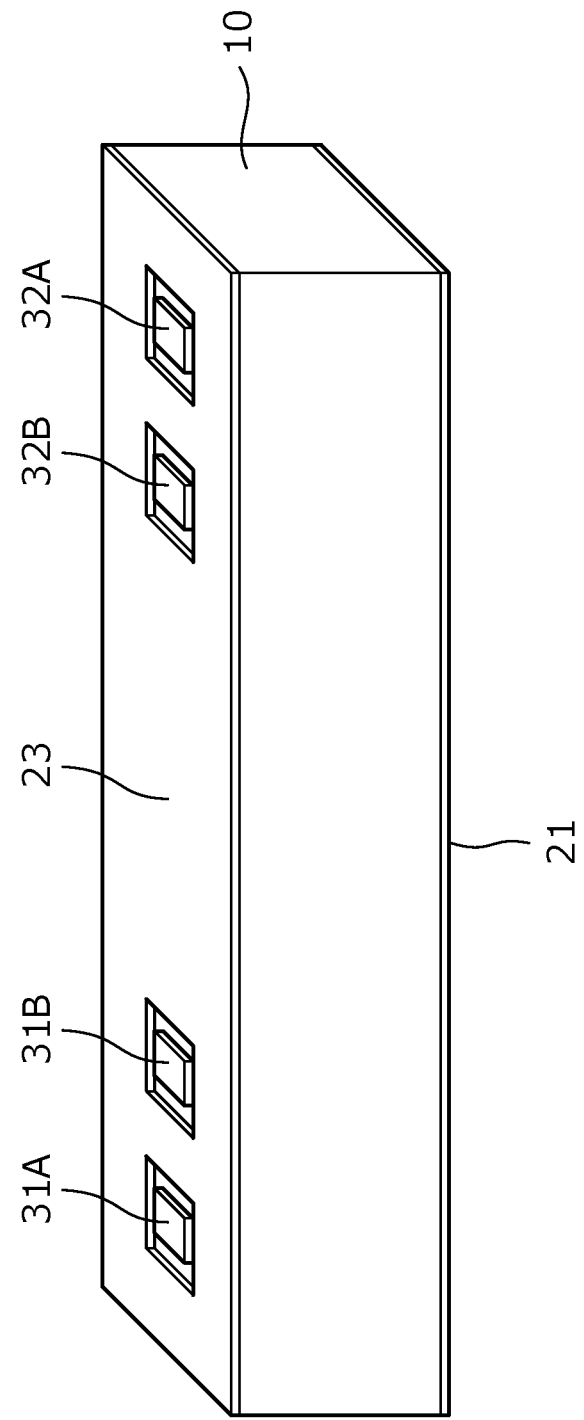
FIG. 17 is a perspective view of the second substrate 205 in the state before the protective film 52 is provided on the second substrate 205.

FIG. 16 is a perspective view of a main portion of a second substrate 205 with which the electronic apparatus according to the fifth preferred embodiment is provided and FIG. 17 is a perspective view of the second substrate 205 in the state before the protective film 52 is provided on the second substrate 205. In addition, FIG. 18 is a perspective view illustrating a structure of a first substrate 105 and the second substrate 205 mounted on the first substrate 105.

The internal structure of the base material 10 is the same or substantially the same as the internal structure shown in FIG. 14 in the fourth preferred embodiment. The second substrate 205 includes a first surface S1, and input/output pads 31A, 31B, 32A, and 32B, and a plurality of auxiliary pads 23P arranged in two lines with the input/output pads 31A, 31B, 32A, and 32B between the two lines provided on the first surface S1. The second substrate 205 is surface-mounted on the first substrate 105 to be described later, using the first surface S1 as a mounting surface.

Figure 18:
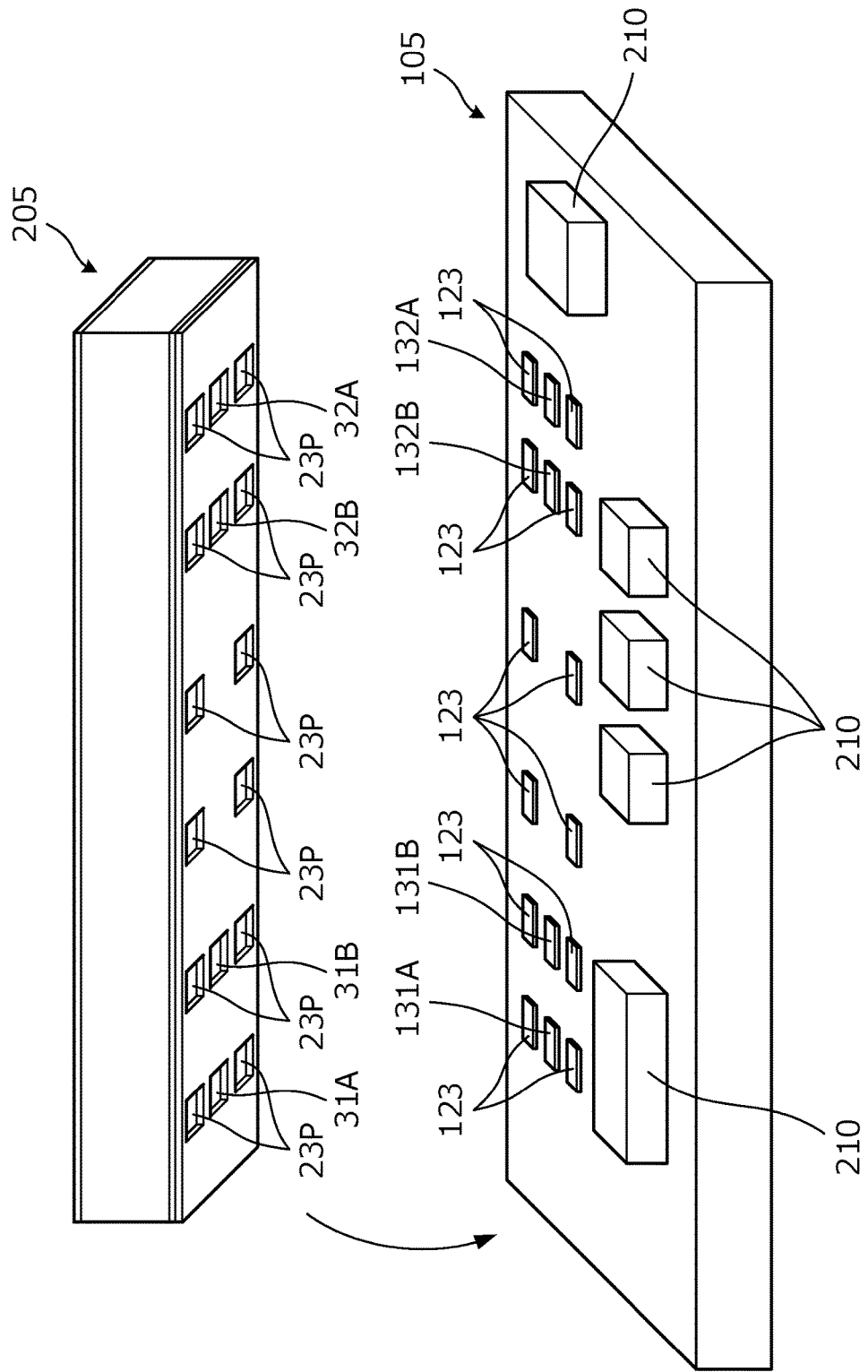
FIG. 18 is a perspective view illustrating a structure of a first substrate 105 and the second substrate 205 mounted on the first substrate 105.

As shown in FIG. 18, the first substrate 105 includes lands 131A, 131B, 132A, and 132B to be connected to the input/output pads 31A, 31B, 32A, and 32B of the second substrate 205, and lands 123 to be connected to the plurality of auxiliary pads 23P, on the upper surface of the first substrate 105. In addition, the first substrate 105 also includes lands to be connected to a plurality of mounting components 210, on the upper surface of the first substrate 105. In the same or substantially the same manner as the mounting components 210, the second substrate 205 is mounted on the first substrate 105.

Sixth Preferred Embodiment

A sixth preferred embodiment of the present invention provides an example of an electronic apparatus provided with a second substrate that includes input/output pads and auxiliary pads in a single line.

Figure 19:
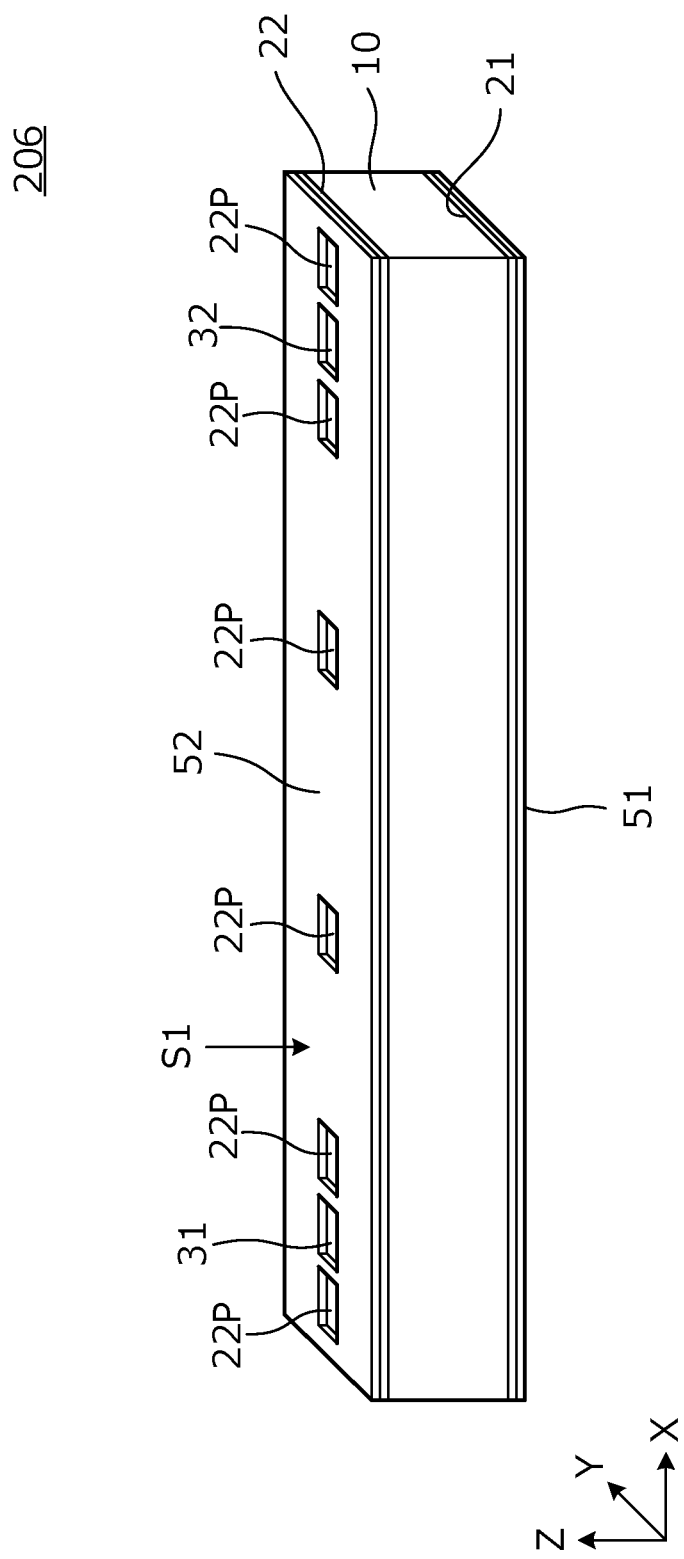
FIG. 19 is a perspective view of a main portion of a second substrate 206 with which an electronic apparatus according to a sixth preferred embodiment of the present invention is provided.
Figure 20:
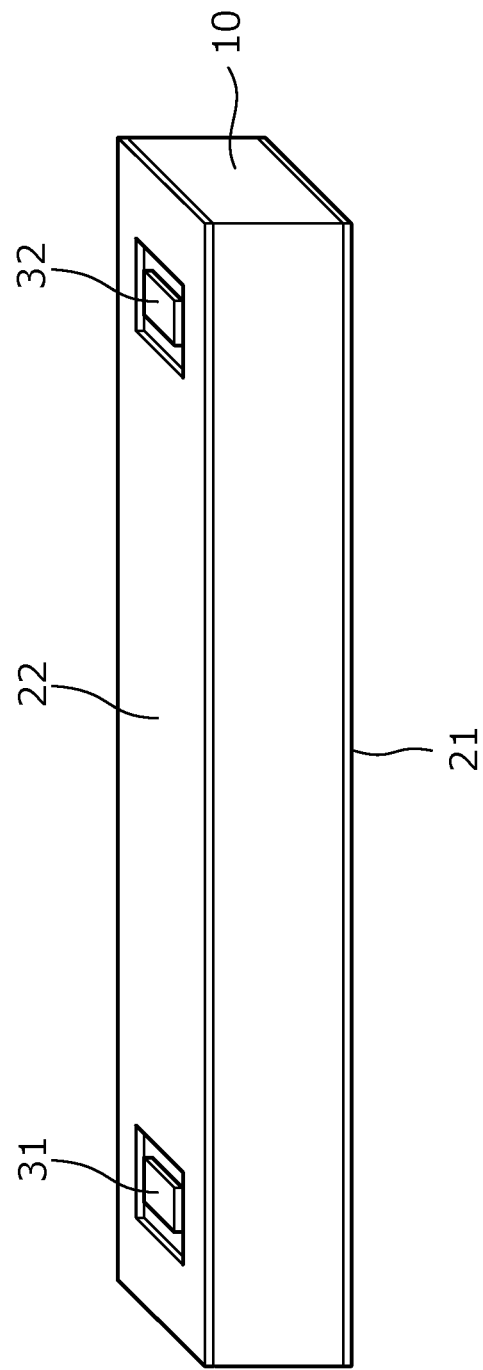
FIG. 20 is a perspective view of the second substrate 206 in the state before the protective film 52 is provided on the second substrate 206.
Figure 21:
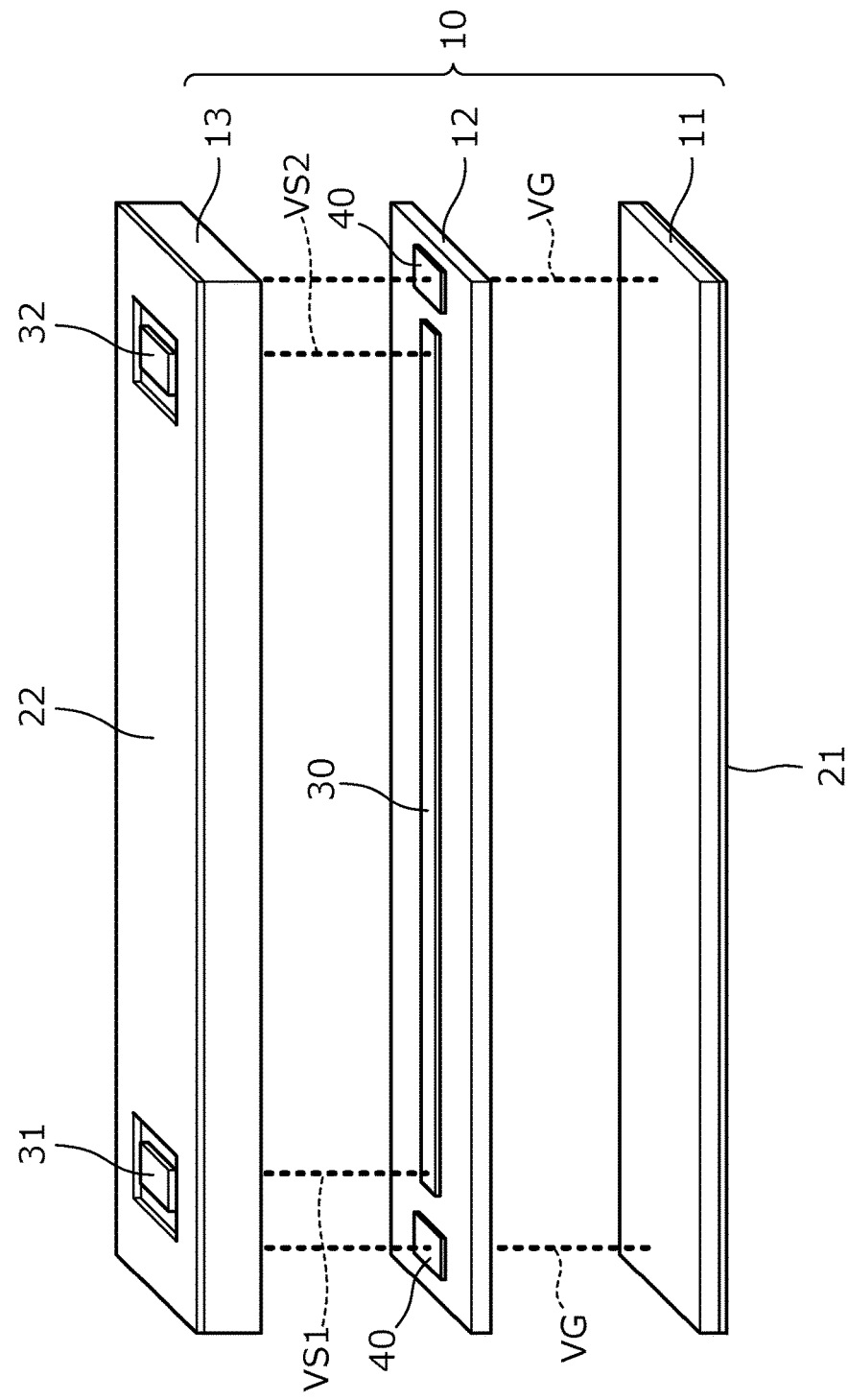
FIG. 21 is an exploded perspective view of the second substrate 206 in the state before the protective film 52 is provided on the second substrate 206.

FIG. 19 is a perspective view of a main portion of a second substrate 206 with which the electronic apparatus according to the sixth preferred embodiment is provided and FIG. 20 is a perspective view of the second substrate 206 in the state before the protective film 52 is provided on the second substrate 206. In addition, FIG. 21 is an exploded perspective view of the second substrate 206 in a state before the protective film 52 is provided on the second substrate 206.

The second substrate 206 is different in the arrangement of the auxiliary pads from the second substrate 201 shown in FIG. 1 in the first preferred embodiment. In the present preferred embodiment, the input/output pads 31 and 32 and the plurality of auxiliary pads 22P are arranged in a single line.

The second substrate 206 includes a first surface S1, and the input/output pads 31 and 32 and the plurality of auxiliary pads 22P, provided on the first surface S1. The second substrate 206 is surface-mounted on the first substrate 101, using the first surface S1 as a mounting surface.

The second substrate 206 further includes a protective film 52 provided on the first surface S1, and a protective film 51 provided on the opposite surface. The protective films 51 and 52, as shown in FIG. 20, include a first ground conductor 21 and a second ground conductor 22, respectively, on the lower layers of the protective films 51 and 52. The plurality of auxiliary pads 22P are each defined by a portion of the second ground conductor 22 exposed in an opening provided in the protective film 52.

The base material 10 of the second substrate 206, as shown in FIG. 21, preferably includes insulating base materials 11, 12, and 13, for example. Each conductor pattern is defined by patterning copper foil attached on each of the insulating base materials. Other configurations are the same or substantially the same as the configuration shown in the first preferred embodiment.

The base material 11 includes the first ground conductor 21 provided on the entire or substantially the entire surface of the lower surface of the base material 11. The base material 12 includes a signal line 30 and a via receiving electrode 40 arranged along the opposite sides of the signal line 30 on the upper surface of the base material 12. The base material 13 includes the second ground conductor 22 and the input/output pads 31 and 32 on the upper surface of the base material 13. The first ground conductor 21 is connected to the second ground conductor 22 through a via VG. In addition, the opposite ends of the signal line 30 are connected to the input/output pads 31 and 32 through vias VS1 and VS2.

The first ground conductor 21, the second ground conductor 22, and the signal line 30 define a high-frequency transmission line having a stripline structure.

According to the present preferred embodiment, since the input/output pads 31 and 32 and the plurality of auxiliary pads 22P are arranged in a single line, the width of the second substrate 206 is able to be further reduced and, thus, the flexibility of the arrangement of the second substrate 206 with respect to the first substrate is high. In addition, the use of the second substrate also increases the flexibility of the layout of the components to be mounted on the first substrate. Moreover, since the input/output pads 31 and 32 and the plurality of auxiliary pads 22P are arranged in one line and are not distributed in all directions, the accuracy of flatness required for the mounting surface of the second substrate is eased. In other words, it is easy to ensure the connection reliability.

Seventh Preferred Embodiment

A seventh preferred embodiment of the present invention provides an example of an electronic apparatus including a plurality of high-frequency transmission lines and provided with a second substrate that includes input/output pads and auxiliary pads in a single line.

Figure 22:
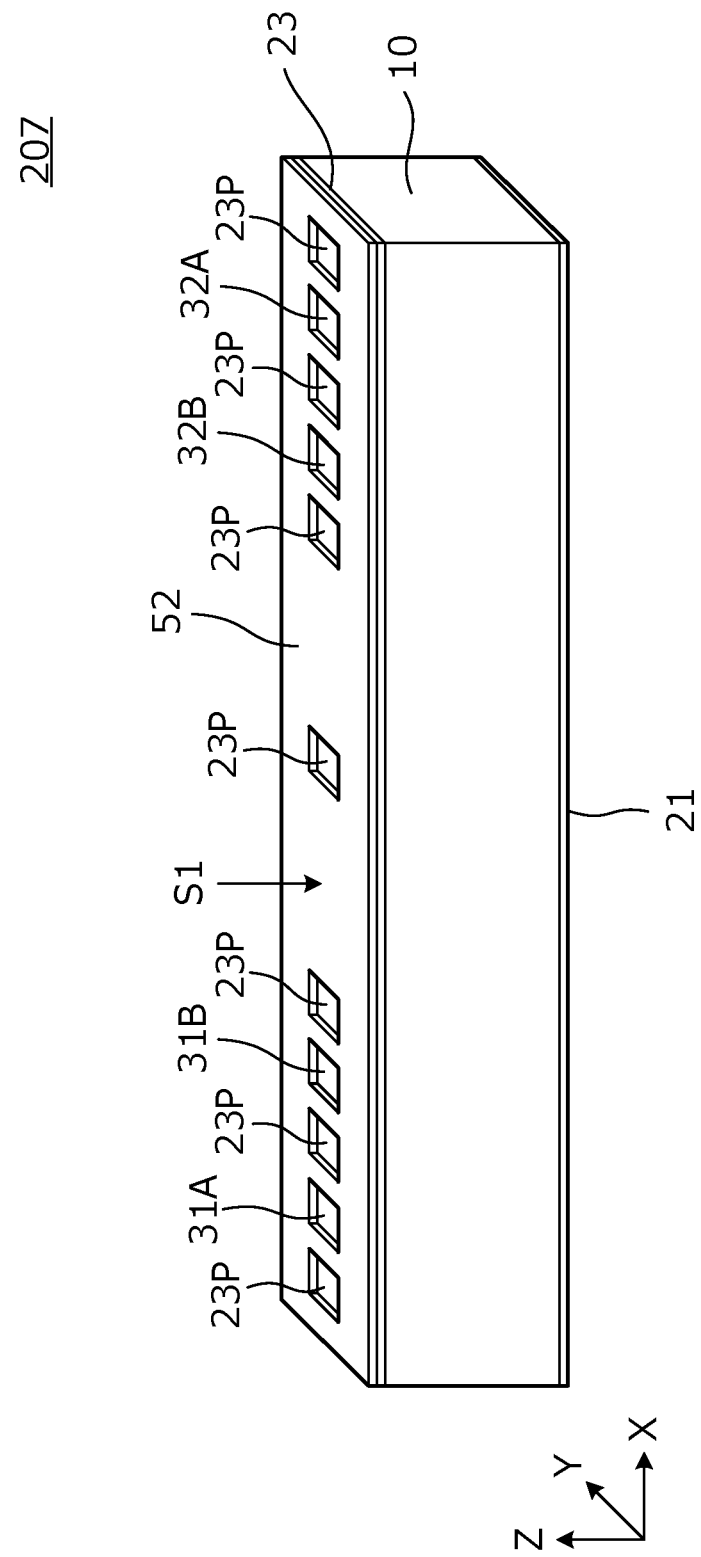
FIG. 22 is a perspective view of a main portion of a second substrate 207 with which an electronic apparatus according to a seventh preferred embodiment of the present invention is provided.
Figure 23:
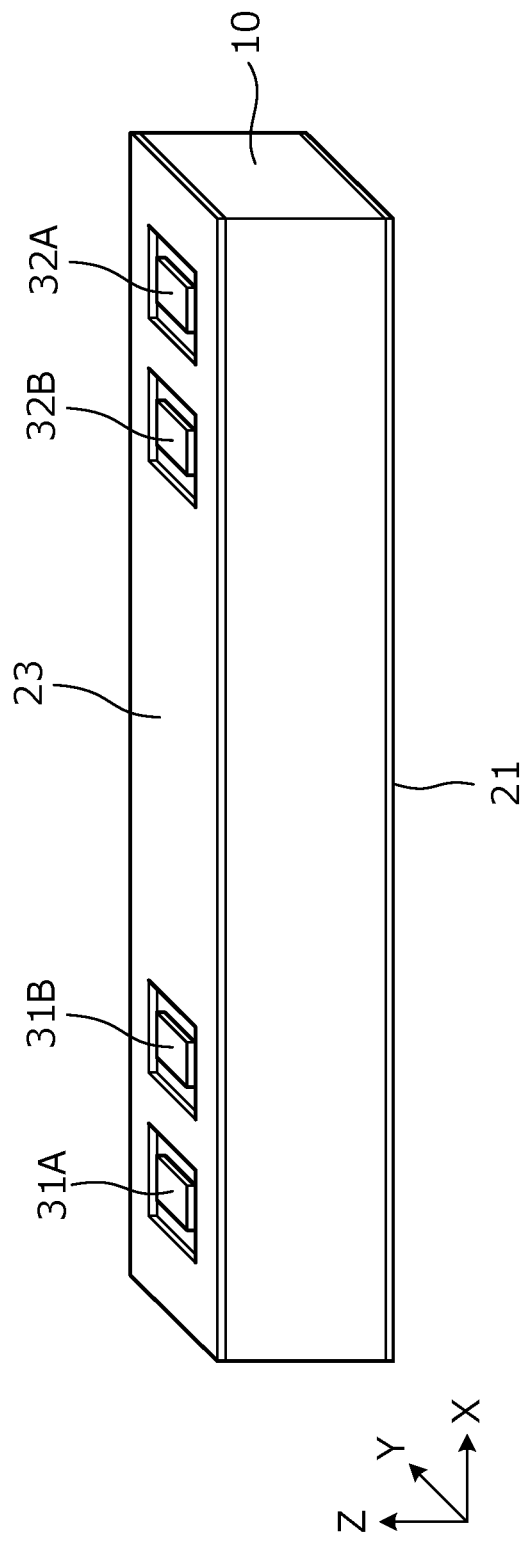
FIG. 23 is a perspective view of the second substrate 207 in the state before the protective film 52 is provided on the second substrate 207.
Figure 24:
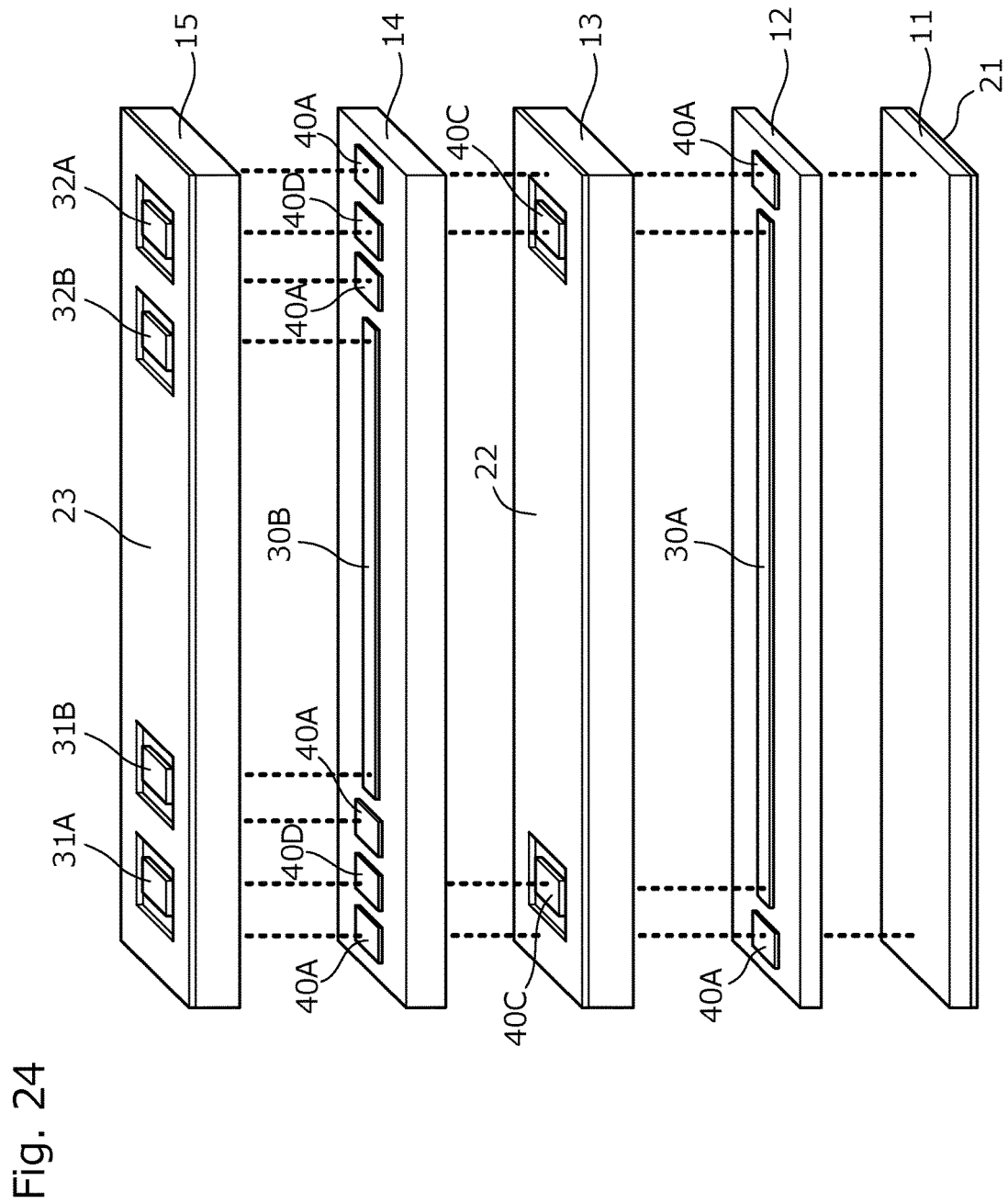
FIG. 24 is an exploded perspective view of the second substrate 207 in the state before the protective film 52 is provided on the second substrate 207.

FIG. 22 is a perspective view of a main portion of a second substrate 207 with which the electronic apparatus according to the seventh preferred embodiment is provided and FIG. 23 is a perspective view of the second substrate 207 in the state before the protective film 52 is provided on the second substrate 207. In addition, FIG. 24 is an exploded perspective view of the second substrate 207 in a state before the protective film 52 is provided on the second substrate 207.

The second substrate 207 is different in the arrangement of the auxiliary pads from the second substrate 204 shown in FIG. 12 in the fourth preferred embodiment. In the present preferred embodiment, the input/output pads 31A, 31B, 32A, and 32B and the plurality of auxiliary pads 23P are arranged in a single line.

As shown in FIG. 22, the second substrate 207 extends in a longitudinal direction (X axial direction in FIG. 22) and has a planar or substantially planar shape of which the width in each portion in the longitudinal direction (dimension in the Y axial direction) is uniform or substantially uniform.

The second substrate 207 includes a first surface S1, and the input/output pads 31A, 31B, 32A, and 32B and the plurality of auxiliary pads 23P provided on the first surface S1. The second substrate 207 is surface-mounted on the first substrate 101, using the first surface S1 as a mounting surface.

The second substrate 207 further includes a protective film 52 provided on the first surface S1. The protective film 52, as shown in FIG. 23, includes a third ground conductor 23 on the lower layer of the protective film 52. The plurality of auxiliary pads 23P are each defined by a portion of the third ground conductor 23 exposed in an opening provided in the protective film 52.

The base material 10 of the second substrate 207, as shown in FIG. 24, preferably includes insulating base materials 11 to 15, for example. Each conductor pattern is defined by patterning copper foil attached on each of the insulating base materials.

The base material 11 includes the first ground conductor 21 provided on the entire or substantially the entire surface of the lower surface of the base material 11. The base material 12 includes a signal line 30A and a via receiving electrode 40A arranged along the opposite sides of the signal line 30A on the upper surface of the base material 12. The base material 13 includes the second ground conductor 22 and a via receiving electrode 40C on the upper surface of the base material 13. The first ground conductor 21 is connected to the second ground conductor 22 through a via. The base material 14 includes a signal line 30B, a via receiving electrode 40A, and a via receiving electrode 40D arranged in the same position as the via receiving electrode 40C on the upper surface of the base material 14. The base material 15 includes a third ground conductor 23 and input/output pads 31A, 31B, 32A, and 32B on the upper surface of the base material 15.

The opposite ends of the signal line 30A are connected to the input/output pads 31A and 32A through the via. In addition, the opposite ends of the signal line 30B are connected to the input/output pads 31B and 32B through the via.

The rest of the configuration is the same or substantially the same as the configuration shown in the fourth preferred embodiment. According to the present preferred embodiment, the arrangement of a plurality of signal lines in the laminating direction and the arrangement of the input/output pads 31A, 31B, 32A, and 32B and the plurality of auxiliary pads 23P makes it possible to provide a further reduced line width and to arrange the second substrate in a limited space on the first substrate. Moreover, since the input/output pads 31A, 31B, 32A, and 32B and the plurality of auxiliary pads 23P are arranged in one line, similarly to the sixth preferred embodiment, it is easy to ensure connection reliability.

It is to be noted that, while the fourth, fifth, and seventh preferred embodiments show the second substrate including two high-frequency transmission lines, in a similar manner, three or more high-frequency transmission lines may be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic apparatus comprising:
   a first substrate that includes a mounting surface; and
   a second substrate that includes a mounting surface, is mounted on the first substrate, and has a smaller area than the first substrate; wherein
   the second substrate extends in a longitudinal direction and has a planar or substantially planar shape with a uniform or substantially uniform width across all portions of the second substrate in the longitudinal direction;
   the second substrate includes:
     a signal line;
     a high-frequency transmission line including the signal line;
     a plurality of input/output pads electrically connected to the signal line on the mounting surface of the second substrate; and
     an auxiliary pad arranged between at least two input/output pads among the plurality of input/output pads on the mounting surface of the second substrate;
   the first substrate includes a plurality of lands provided on the mounting surface of the first substrate, each of the plurality of lands being respectively connected to a corresponding input/output pad or auxiliary pad;
   each of the input/output pad and the auxiliary pad is respectively soldered to a corresponding land on the mounting surface of the first substrate and the second substrate is surface-mounted on the first substrate in a state in which an entirety or substantially an entirety of the mounting surface of the second substrate faces the mounting surface of the first substrate; and
   the second substrate includes a base material with a dielectric constant lower than a dielectric constant of the first substrate.

2. An electronic apparatus comprising:
   a first substrate that includes a mounting surface; and
   a second substrate that includes a mounting surface, is mounted on the first substrate, and has a smaller area than the first substrate; wherein
   the second substrate extends in a longitudinal direction and has a planar or substantially planar shape with a uniform or substantially uniform width across all portions of the second substrate in the longitudinal direction;
   the second substrate includes:
     a signal line;
     a high-frequency transmission line including the signal line;
     a plurality of input/output pads electrically connected to the signal line on the mounting surface of the second substrate; and
     an auxiliary pad arranged between at least two input/output pads among the plurality of input/output pads on the mounting surface of the second substrate;
   the first substrate includes a plurality of lands provided on the mounting surface of the first substrate, each of the plurality of lands being respectively connected to a corresponding input/output pad or auxiliary pad;
   each of the input/output pad and the auxiliary pad is respectively soldered to a corresponding land on the mounting surface of the first substrate and the second substrate is surface-mounted on the first substrate in a state in which an entirety or substantially an entirety of the mounting surface of the second substrate faces the mounting surface of the first substrate;
the high-frequency transmission line includes a ground conductor;
the auxiliary pad is defined by a portion of the ground conductor;
a protective film is provided on the ground conductor, the protective film including at least one opening therein; and
the auxiliary pad is defined by a portion of the ground conductor exposed in the at least one opening.

3. An electronic apparatus comprising:
a first substrate that includes a mounting surface; and
a second substrate that includes a mounting surface, is mounted on the first substrate, and has a smaller area than the first substrate; wherein
the second substrate extends in a longitudinal direction and has a planar or substantially planar shape with a uniform or substantially uniform width across all portions of the second substrate in the longitudinal direction;
the second substrate includes:
  a signal line;
  a high-frequency transmission line including the signal line;
  a plurality of input/output pads electrically connected to the signal line on the mounting surface of the second substrate; and
  an auxiliary pad arranged between at least two input/output pads among the plurality of input/output pads on the mounting surface of the second substrate;
the first substrate includes a plurality of lands provided on the mounting surface of the first substrate, each of the plurality of lands being respectively connected to a corresponding input/output pad or auxiliary pad;
each of the input/output pad and the auxiliary pad is respectively soldered to a corresponding land on the mounting surface of the first substrate and the second substrate is surface-mounted on the first substrate in a state in which an entirety or substantially an entirety of the mounting surface of the second substrate faces the mounting surface of the first substrate;
the second substrate further includes a bent portion that bends in a planar direction of the mounting surface of the first substrate; and
the second substrate is arranged on the first substrate so as to avoid components mounted on the first substrate.

4. An electronic apparatus comprising:
a first substrate that includes a mounting surface; and
a second substrate that includes a mounting surface, is mounted on the first substrate, and has a smaller area than the first substrate; wherein
the second substrate extends in a longitudinal direction and has a planar or substantially planar shape with a uniform or substantially uniform width across all portions of the second substrate in the longitudinal direction;
the second substrate includes:
  a signal line;
  a high-frequency transmission line including the signal line;
  a plurality of input/output pads electrically connected to the signal line on the mounting surface of the second substrate; and
  an auxiliary pad arranged between at least two input/output pads among the plurality of input/output pads on the mounting surface of the second substrate;
the first substrate includes a plurality of lands provided on the mounting surface of the first substrate, each of the plurality of lands being respectively connected to a corresponding input/output pad or auxiliary pad;
each of the input/output pad and the auxiliary pad is respectively soldered to a corresponding land on the mounting surface of the first substrate and the second substrate is surface-mounted on the first substrate in a state in which an entirety or substantially an entirety of the mounting surface of the second substrate faces the mounting surface of the first substrate;
the first substrate includes a level difference portion; and
the second substrate is surface-mounted on the first substrate along the level difference portion.

5. An electronic apparatus comprising:
a first substrate that includes a mounting surface; and
a second substrate that includes a mounting surface, is mounted on the first substrate, and has a smaller area than the first substrate; wherein
the second substrate extends in a longitudinal direction and has a planar or substantially planar shape with a uniform or substantially uniform width across all portions of the second substrate in the longitudinal direction;
the second substrate includes:
  a signal line;
  a high-frequency transmission line including the signal line;
  a plurality of input/output pads electrically connected to the signal line on the mounting surface of the second substrate; and
  an auxiliary pad arranged between at least two input/output pads among the plurality of input/output pads on the mounting surface of the second substrate;
the first substrate includes a plurality of lands provided on the mounting surface of the first substrate, each of the plurality of lands being respectively connected to a corresponding input/output pad or auxiliary pad;
each of the input/output pad and the auxiliary pad is respectively soldered to a corresponding land on the mounting surface of the first substrate and the second substrate is surface-mounted on the first substrate in a state in which an entirety or substantially an entirety of the mounting surface of the second substrate faces the mounting surface of the first substrate;
the second substrate further includes:
  a plurality of base material layers; and
  a plurality of conductor layers provided on the plurality of base material layers; and
among the plurality of conductor layers, a conductor layer on which the plurality of input/output pads are provided is thickest.

6. An electronic apparatus comprising:
a first substrate that includes a mounting surface; and
a second substrate that includes a mounting surface, is mounted on the first substrate, and has a smaller area than the first substrate; wherein
the second substrate extends in a longitudinal direction and has a planar or substantially planar shape with a uniform or substantially uniform width across all portions of the second substrate in the longitudinal direction;
the second substrate includes:
  a signal line;
  a high-frequency transmission line including the signal line;

a plurality of input/output pads electrically connected to the signal line on the mounting surface of the second substrate; and an auxiliary pad arranged between at least two input/output pads among the plurality of input/output pads on the mounting surface of the second substrate, and having a width smaller than the width of the second substrate;

the first substrate includes a plurality of lands provided on the mounting surface of the first substrate, each of the plurality of lands being respectively connected to a corresponding input/output pad or auxiliary pad; and each of the input/output pad and the auxiliary pad is respectively soldered to a corresponding land on the mounting surface of the first substrate and the second substrate is surface-mounted on the first substrate in a state in which an entirety or substantially an entirety of the mounting surface of the second substrate faces the mounting surface of the first substrate.

7. The electronic apparatus according to claim 6, wherein the at least two input/output pads and the auxiliary pad are arranged in the longitudinal direction.

8. The electronic apparatus according to claim 6, wherein the auxiliary pad includes a plurality of auxiliary pads.

9. The electronic apparatus according to claim 8, wherein the plurality of auxiliary pads include at least three auxiliary pads or more.

10. The electronic apparatus according to claim 9, wherein the plurality of auxiliary pads include a plurality of auxiliary pads provided at equal or substantially equal intervals.

11. The electronic apparatus according to claim 10, wherein the plurality of auxiliary pads are arranged in two lines in the longitudinal direction so as to interpose at least one of the plurality of input/output pads between the two lines in a width direction perpendicular or substantially perpendicular to the longitudinal direction.

12. The electronic apparatus according to claim 10, wherein the plurality of auxiliary pads interpose at least one of the plurality of input/output pads in the longitudinal direction.

13. The electronic apparatus according to claim 9, wherein the plurality of auxiliary pads are arranged in two lines in the longitudinal direction so as to interpose at least one of the plurality of input/output pads between the two lines in a width direction perpendicular or substantially perpendicular to the longitudinal direction.

14. The electronic apparatus according to claim 9, wherein the plurality of auxiliary pads interpose at least one of the plurality of input/output pads in the longitudinal direction.

15. The electronic apparatus according to claim 8, wherein the plurality of auxiliary pads are arranged in two lines in the longitudinal direction so as to interpose at least one of the plurality of input/output pads between the two lines in a width direction perpendicular or substantially perpendicular to the longitudinal direction.

16. The electronic apparatus according to claim 8, wherein the plurality of auxiliary pads interpose at least one of the plurality of input/output pads in the longitudinal direction.

* * * * *